(12) United States Patent
Yilmaz et al.

(10) Patent No.: US 9,245,949 B2
(45) Date of Patent: Jan. 26, 2016

(54) NANOTUBE SEMICONDUCTOR DEVICES

(71) Applicant: Alpha and Omega Semiconductor Incorporated, Sunnyvale, CA (US)

(72) Inventors: Hamza Yilmaz, Saratoga, CA (US); Xiaobin Wang, San Jose, CA (US); Anup Bhalla, Santa Clara, CA (US); John Chen, Palo Alto, CA (US); Hong Chang, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/561,172

(22) Filed: Dec. 4, 2014

(65) Prior Publication Data
US 2015/0155354 A1 Jun. 4, 2015

Related U.S. Application Data

(60) Continuation of application No. 14/243,758, filed on Apr. 2, 2014, now Pat. No. 8,928,031, which is a continuation of application No. 14/058,874, filed on Oct. 21, 2013, now Pat. No. 8,729,601, which is a continuation of application No. 13/624,066, filed on Sep. 21, 2012, now Pat. No. 8,598,623, which is a division of application No. 12/484,170, filed on Jun. 12, 2009, now Pat. No. 8,299,494.

(51) Int. Cl.
*H01L 27/095* (2006.01)
*H01L 29/47* (2006.01)
(Continued)

(52) U.S. Cl.
CPC ........ *H01L 29/0676* (2013.01); *H01L 29/0634* (2013.01); *H01L 29/0886* (2013.01); *H01L 29/4236* (2013.01); *H01L 29/66136* (2013.01); *H01L 29/66143* (2013.01); *H01L 29/66348* (2013.01); *H01L 29/66734* (2013.01); *H01L 29/7395* (2013.01); *H01L 29/7397* (2013.01); *H01L 29/7803* (2013.01); *H01L 29/7806* (2013.01); *H01L 29/7811* (2013.01); *H01L 29/7813* (2013.01); *H01L 29/7827* (2013.01); *H01L 29/861* (2013.01); *H01L 29/872* (2013.01); *H01L 21/26586* (2013.01); *H01L 29/0619* (2013.01); *H01L 29/0638* (2013.01); *H01L 29/0649* (2013.01);
(Continued)

(58) Field of Classification Search
CPC ............ H01L 29/7395; H01L 29/7827; H01L 29/4236; H01L 29/0676; H01L 29/7397
USPC ......................................... 257/139, 332, 471
See application file for complete search history.

(56) References Cited

U.S. PATENT DOCUMENTS 5,981,996 A * 11/1999 Fujishima ..................... 257/335
6,700,175 B1 * 3/2004 Kodama et al. ............... 257/489
7,029,977 B2 * 4/2006 Kishimoto et al. ........... 438/269

*Primary Examiner* — David S Blum
(74) *Attorney, Agent, or Firm* — Van Pelt, Yi & James LLP

(57) ABSTRACT

Semiconductor devices are formed using a thin epitaxial layer (nanotube) formed on sidewalls of dielectric-filled trenches. In one embodiment, a semiconductor device is formed in a semiconductor layer on a semiconductor substrate of opposite conductivity type and having trenches formed therein where the trenches extend from the top surface to the bottom surface of the semiconductor layer. The semiconductor device includes a first epitaxial layer formed on sidewalls of the trenches where the first epitaxial layer is substantially charge balanced with adjacent semiconductor regions. In another embodiment, a semiconductor device is formed in a first semiconductor layer having trenches and mesas formed thereon where the trenches extend from the top surface to the bottom surface of the first semiconductor layer. The semiconductor device includes semiconductor regions formed on the bottom surface of the mesas of the first semiconductor layer.

24 Claims, 35 Drawing Sheets

(51) Int. Cl.
*H01L 29/812* (2006.01)
*H01L 31/07* (2012.01)
*H01L 31/108* (2006.01)
*H01L 29/74* (2006.01)
*H01L 31/111* (2006.01)
*H01L 29/06* (2006.01)
*H01L 29/66* (2006.01)
*H01L 29/739* (2006.01)
*H01L 29/78* (2006.01)
*H01L 29/861* (2006.01)
*H01L 29/872* (2006.01)
*H01L 21/265* (2006.01)
*H01L 29/08* (2006.01)
*H01L 29/36* (2006.01)
*H01L 29/40* (2006.01)
*H01L 29/423* (2006.01)

(52) U.S. Cl.
CPC ........ *H01L 29/0653* (2013.01); *H01L 29/0692* (2013.01); *H01L 29/0696* (2013.01); *H01L 29/0878* (2013.01); *H01L 29/365* (2013.01); *H01L 29/402* (2013.01); *H01L 29/404* (2013.01); *H01L 29/42368* (2013.01)

NANOTUBE SEMICONDUCTOR DEVICES

CROSS-REFERENCE TO RELATED APPLICATION

This application is a continuation of U.S. patent application Ser. No. 14/243,758, now U.S. Pat. No. 8,928,031, entitled NANOTUBE SEMICONDUCTOR DEVICES, filed Apr. 2, 2014, which is a continuation of U.S. patent application Ser. No. 14/058,874, now U.S. Pat. No. 8,729,601, entitled NANOTUBE SEMICONDUCTOR DEVICES, filed Oct. 21, 2013, which is a continuation of U.S. patent application Ser. No. 13/624,066, now U.S. Pat. No. 8,598,623, entitled NANOTUBE SEMICONDUCTOR DEVICES AND NANOTUBE TERMINATION STRUCTURES, filed Sep. 21, 2012, which is a divisional of U.S. patent application Ser. No. 12/484,170, now U.S. Pat. No. 8,299,494, entitled NANOTUBE SEMICONDUCTOR DEVICES filed Jun. 12, 2009, all of which are incorporated herein by reference for all purposes.

The present application is related to commonly assigned U.S. patent application entitled "Method For Forming Nanotube Semiconductor Devices," filed Jun. 12, 2009, of the same inventors hereof, having patent application Ser. No. 12/484,166, now U.S. Pat. No. 7,910,486, issued on Mar. 22, 2011, which patent application is incorporated herein by reference in its entirety.

FIELD OF THE INVENTION

The invention relates to nanotube vertical trench MOSFET semiconductor devices and, in particular, to a process of forming nanotube vertical trench MOSFET devices using sidewall epitaxial layers. Furthermore, the invention relates to structures for edge termination in charge balance power devices.

DESCRIPTION OF THE RELATED ART

Metal-oxide-silicon field effect transistor (MOSFET) devices are formed using various lateral and vertical structures. Lateral MOSFET devices have fast switching speed but are less dense than vertical MOSFET devices. Vertical MOSFET devices can be used to form a high density array of transistors but vertical MOSFETs typically have large gate-to-drain capacitance (Cgd) and drain-to-source capacitance (Cds). Consequently, vertical MOSFETs are associated with slower switching speed. Shielded Gate Structure Transistors (SGT) have lower gate-to-drain capacitance (Cgd) but SGT devices increase the variation of the drain-to-source "on" resistance (Rdson) and the gate-to-drain capacitance (Cgd) due to the non-self aligned nature of gate oxide and the N-drift region overlap. Furthermore, Inter Poly Dielectric (IPD) and trench etch (side wall angle) unit step processes makes SGT process complex and expensive. Additionally, increased output capacitance and resistance of the shielded gate poly silicon will slow down switching speed of SGT.

U.S. Pat. No. 5,981,996 to Fujishima discloses a vertical trench MOSFET device where an N-type drain drift region is formed on the sidewall of the trench by oblique ion implantation and then diffusion through heat treatment. When the N-type drain drift region is formed by ion implantation and diffusion, the drain drift region has a concentration gradient. That is, the dopant concentration is not uniform across the drain drift region and has variation in the horizontal and vertical direction across the drain drift region.

SUMMARY OF THE INVENTION

In some embodiments, a semiconductor device includes a heavily doped semiconductor substrate of a first conductivity type; a semiconductor layer of a second conductivity type formed on the heavily doped semiconductor substrate where the semiconductor layer includes trenches formed therein with the trenches extending close to, up to, or into the semiconductor substrate, the trenches forming mesas in the semiconductor layer; a first epitaxial layer of the second conductivity type formed on sidewalls of the trenches, adjacent the mesas; a second epitaxial layer of the first conductivity type formed on the first epitaxial layer; a first dielectric layer formed in the remaining trenches, adjacent the second epitaxial layer, where the first dielectric layer fills at least part of the trenches; a gate dielectric layer formed on the sidewalls of the trenches above the first dielectric layer; and a gate conductive layer formed in a first trench above the first dielectric layer and adjacent the gate dielectric layer. The first epitaxial layer and the second epitaxial layer form adjacent doped regions along the sidewalls of the trenches. The second epitaxial layer has a first thickness and a first doping concentration and the first epitaxial layer and a mesa of the semiconductor layer together have a second thickness and a second average doping concentration. The first and second thicknesses and the first and second doping concentrations are selected to achieve charge balance in operation.

In other embodiments, a semiconductor device includes a first semiconductor layer of a first conductivity type including trenches formed therein where the trenches extend from a top surface to a bottom surface of the first semiconductor layer and form mesas in the first semiconductor layer; first semiconductor regions of a second conductivity type formed on the bottom surface of the mesas of the first semiconductor layer; a first epitaxial layer of the second conductivity type formed on sidewalls of the trenches and covering at least sidewalls of the mesas of the first semiconductor layer where the first epitaxial layer is electrically connected to the first semiconductor regions formed at the bottom surface of the mesas; a first dielectric layer formed in the trenches adjacent the first epitaxial layer where the first dielectric layer fills at least part of the trenches; a gate dielectric layer formed on the sidewalls of at least a first trench above the first dielectric layer; and a gate conductive layer formed in the first trench above the first dielectric layer and adjacent the gate dielectric layer. The first epitaxial layer forms doped regions along the sidewalls of the trenches. The first epitaxial layer has a first thickness and a first doping concentration and a mesa of the first semiconductor layer have a second thickness and a second doping concentration. The first and second thicknesses and the first doping concentration and second doping concentrations are selected to achieve charge balance in operation.

The present invention is better understood upon consideration of the detailed description below and the accompanying drawings.

DETAILED DESCRIPTION OF THE PREFERRED EMBODIMENTS

Figure 1:
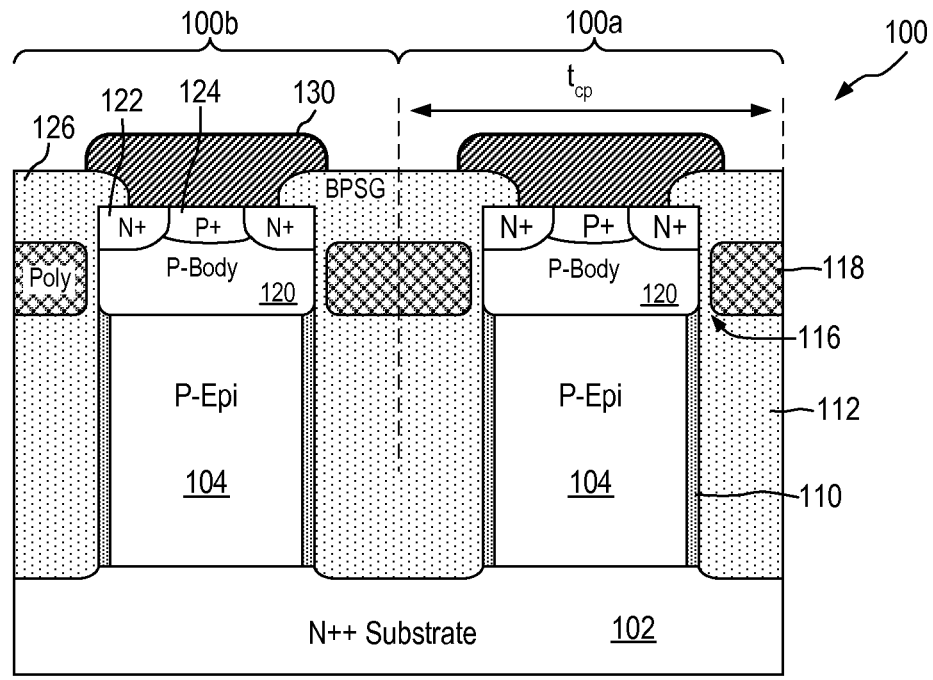
FIG. 1 is a cross-sectional view of a vertical trench MOSFET device according to a first embodiment of the present invention.

In accordance with the principles of the present invention, a vertical trench MOSFET device formed in a semiconductor layer with a dielectric-filled trench includes a thin epitaxial layer ("nanotube") having submicron to a few micron thickness formed on the sidewall of the trench as the drain drift region. The drain drift region thus formed has uniform doping concentration. The uniform doping profile of the drain drift region improves the charge balance operation of the transistor, thereby enhancing the breakdown voltage characteristic of the transistor. The thickness of the nanotube epitaxial layer is a function of the desired blocking voltage level. For a 30V device, the nanotube thickness can have a submicron thickness. For a 600V device, the nanotube thickness can have a thickness on the order of a few microns.

In another embodiment, the vertical trench MOSFET device includes a first thin epitaxial layer formed on the sidewall of the trench and a second thin epitaxial layer of the opposite conductivity type formed on the first epitaxial layer. The second epitaxial layer forms the drain drift region and both thin epitaxial layers ("double nanotubes") have uniform doping concentration. The uniform doping concentration of the first epitaxial layer further enhances the charge balancing operation of the transistor, ensuring even higher breakdown voltages to be achieved. In other embodiments, an insulated gate bipolar transistor, a Schottky diode, and a P-N junction diode are formed using the basic vertical trench MOSFET structure including the first and second thin epitaxial layers.

The vertical trench MOSFET device of the present invention realizes low on-state resistance (A*Rdson) by using the nanotube concept to form a charge balanced drift region (the "nanotube") on the sidewall of the trench. Furthermore, the nanotube drift region is formed using an epitaxial layer to ensure uniform doping concentration. Since the nanotube is very thin, the nanotube layer can be grown epitaxially at a slow rate in a highly controlled manner to achieve the desired uniform doping concentration. The high and uniform doping concentration of the drift region reduces the on-resistance of the transistor while the highly controlled charge balance ensures that the entire drift region can be depleted horizontally to achieve high breakdown voltage.

In the alternate embodiment, a second nanotube region of the opposite conductivity is provided which borders the nanotube drift region. The second nanotube region is also formed using an epitaxial layer to ensure uniform doping concentration. In the conventional devices, the base semiconductor layer in which the vertical trench MOSFET device is formed has inherent doping concentration variations. Such variations affect the breakdown characteristics of the transistor, as the electric field across the region under depletion is not uniform, nor is charge balance achieved. In the vertical trench MOSFET device of the present invention, the nanotube drift region is bordered by a nanotube body region, both with uniform doping concentration. Therefore, the nanotube drift region and the nanotube body region can be depleted uniformly with a uniform electric field distribution to ensure a high breakdown voltage characteristic. The base semiconductor layer on which the nanotube body region and the nanotube drift region are formed may be very lightly doped, so that its contribution to the charge balance is very small—thus the inherent doping variations within the base semiconductor layer have negligible effects on the charge balance.

A salient feature of the vertical trench MOSFET devices of the present invention is that the nanotube regions are formed using an epitaxial process to ensure uniform doping concentration. Conventional processes for forming the trench side drift region use ion implantation and subsequent annealing and diffusion which results in a drift region with concentration gradient. By forming a drift region that has uniform doping concentration, the charge balance effect of the transistor is enhanced and the breakdown voltage characteristic is improved. Furthermore, the vertical trench MOSFET device of the present invention is manufactured using a low temperature process after the formation of the nanotubes to avoid out-diffusion of the nanotube regions. Conventional fabrication processes employ high process temperature, such as greater than 1100° C., which would cause the thin epitaxial layer forming the nanotube regions to out-diffuse. According to one embodiment of the present invention, the vertical trench MOSFET device is manufactured using a low temperature fabrication process, such as 1000° C. or below, so that the thin epitaxial layers forming the nanotube regions do not out-diffuse and remain as distinctly defined doped regions.

The vertical trench MOSFET device of the present invention can be constructed to realize a breakdown voltage from 20V to 1200V. For breakdown voltages of 20V to 100V, the single nanotube drift region structure can be used. When breakdown voltages of 100V or more are desired, the double nanotube structure may be used to achieve a uniform electric field distribution in the depletion region.

Moreover, the vertical trench MOSFET device of the present invention improves switching speed by using an extended dielectric-filled trench which extends into the heavily doped substrate. In this manner, parasitic capacitances, such as the gate-to-drain capacitance Cgd, are reduced and the switching performance of the transistor device is improved. In this manner, the vertical trench MOSFET device structure of the present invention realizes the advantage of high switching speed of a lateral MOS transistor while reaping the benefit of high density possible only with vertical transistor structures.

FIG. 1 is a cross-sectional view of a vertical trench MOSFET device according to a first embodiment of the present invention. Referring to FIG. 1, an N-type vertical trench MOSFET device ("NMOS transistor") 100 is formed in an array of parallely connected transistor cells 100a and 100b. A desired number of transistor cells are used to form the array to realize an NMOS transistor 100 having the desired breakdown voltage and Rdson (drain-to-source "On" resistance) characteristic. The transistor array can be a 1-dimensional or 2-dimensional array depending on the number of transistor cells involved. For instance, a stripe cell structure can be used for a 1-dimensional array and a hexagonal cell structure can be used for a 2-dimensional array, as will be described in more detail below.

NMOS transistor 100 is formed on a very heavily doped N++ substrate 102. N++ substrate 102 serves as the drain electrode of the transistor. Oxide-filled trenches 112 are formed in a P-type epitaxial (P-Mesa-Epi) layer 104. The thick oxide layer in the oxide-filled trenches 112 decouples the gate 118 from the drain, reducing the gate-to-drain capacitance Cgd and improving the switching speed of the transistor. A thin N-type epitaxial (N-Epi) layer 110 (the "nanotube") is formed on the sidewall of the oxide-filled trenches 112 to function as the N-type drain drift region of transistor 100. The polysilicon gate 118 is formed in the trenches adjacent to a gate oxide layer 116 formed on the sidewall of the oxide-filled trenches 112. A P-type body region 120 is formed in the P-Mesa-Epi layer 104 and extends to almost the bottom edge of the polysilicon gate 118. An N+ source region 122 and a P+ body contact region 124 are formed at the top portion of the P-Mesa-Epi layer 104. The N+ source region 122 extends only to the top edge of the polysilicon gate 118. A BPSG layer 126 covers the entire structure and openings are made to the N+ source region 122 and the P+ body contact region 124 to allow a source contact electrode 130 to be formed for making electrical connection to the source and the body of transistor 100.

As thus configured, the drain drift region of NMOS transistor 100 is formed using the thin N-Epi layer 110 having submicron to a few microns thickness and uniform doping concentration. In one embodiment, N-Epi layer 110 has a thickness of less than 1 µm. For instance, in one embodiment, N-Epi layer 110 has a thickness of around 100 nm. The width or thickness of the nanotube epitaxial layer for low voltage applications (about 30V) may be in the range of about 0.05-0.2 µm. The width or thickness for mid-voltage applications (60-200V) may be in the range of about 0.1-0.2 µm. The width or thickness for high voltage applications (>200V) may be about 0.2-2 µm. The optimum thickness of the nanotube for each voltage level depends in part on the epitaxial growth tools available. As epitaxial growth technology improves, the optimal thickness can change.

In operation, when NMOS transistor 100 is in the off-state, a depletion layer expands from the P-N junction between the N-drift region 110 and the P-Mesa-Epi layer 104. The thin N-Epi layer 110 and the thick P-Mesa-Epi layer 104 are completely depleted to produce a balanced space charge region in the body of the transistor. The balanced space charge in this region allows a high breakdown voltage to be achieved. More specifically, charge balance in a vertical trench MOSFET is achieved by selecting a thickness ratio and a doping concentration ratio for the N-drift region and the P-Mesa-Epi layer so that: NXn=PXp, where N denotes the doping concentration and Xn denotes the thickness of the N-drift region, and P denotes the doping concentration and Xp denotes the thickness of the P-Mesa-Epi layer. The charge balance allows for high concentrations to be used for the drift region to achieve low Rdson, while still attaining high breakdown voltage. The uniform doping concentration of the N-Epi layer 110 improves the uniformity of the electric field distribution in the depletion region, thereby improving the breakdown voltage characteristic.

FIGS. 3(*a*) to 3(*h*) are cross-sectional views illustrating the fabrication process steps for forming the vertical trench MOSFET device of FIG. 1 according to one embodiment of the present invention. Referring to FIG. 3(*a*), the fabrication process starts with the very heavily doped N++ substrate 102. The P-Mesa-Epi layer 104 is grown on substrate 102. Then, referring to FIG. 3(*b*), the structure is subjected to masking and anisotropic etching to form trenches 106 in the P-Mesa-Epi layer 104. The trenches extend all the way through the P-Mesa-Epi layer 104 and partially into N++ substrate 102. In other embodiments, the trenches are etched close to or up to the substrate 102 and do not extend into the substrate. The exact depth of the trenches is not critical except that the bottom of the trench should be close to the N++ substrate 102 enough to allow the substrate to counter-dope the bottoms of the subsequently formed thin epitaxial layers, as described in more detail below. As thus formed, the P-Mesa-Epi layer 104 includes trenches and mesas. The doping level of P-Mesa-Epi layer 104 is selected to achieve a balanced space charge when depleted under reverse bias and is in part a function of the width of the mesas. For instance, when the width of a mesa is 0.333 μm, the P-Mesa-Epi layer 104 will have a doping level of about $6 \times 10^{16}$ cm$^{-3}$.

Referring to FIG. 3(*c*), an epitaxial process is carried out to grow an N-type epitaxial (N-Epi) layer 110 on the exposed surfaces of the semiconductor structure. Thus, the N-Epi layer is grown on the sidewalls and the top surfaces of P-Mesa-Epi layer 104 and on the exposed surface of N++ substrate 102. In an alternative embodiment, a hard mask used to form trenches 106 may be left on top of the P-Mesa-Epi layer 104 during the nanotube epitaxial growth process, so that the N-Epi layer 110 is only grown within the trenches 106. Then, an oxide layer 113 is deposited to fill the trenches 106, as shown in FIG. 3(*d*). The deposited oxide layer 113 extends to cover the mesas of the P-Mesa-Epi layer 104. Because substrate 102 is very heavily doped (N++ substrate), out-diffusion of the N-type dopants from the substrate occurs even during the epitaxial growth process and continues throughout the remaining fabrication process so that the portions of the N-Epi layer 110 (denoted by dotted circle 114) that are formed on the N++ substrate 102 are washed out due to out-diffusion of the very heavily doped N++ substrate 102. Subsequent to the oxide deposition, a chemical mechanical polishing (CMP) process may be carried out to planarize the surface of the semiconductor structure. The CMP process removes the excess oxide and the thin N-Epi layer on the top of the mesas of the P-Mesa-Epi layer 104.

Referring to FIG. 3(*e*), the deposited oxide layer 113 in the trenches is etched down so that the oxide layer fills only part of the trenches, forming oxide-filled trenches 112. More specifically, the deposited oxide layer 113 is etched down precisely to the desired depth to ensure that the subsequent gate electrode aligns with the body region. A gate oxide layer 116 is grown on the sidewalls of the trenches. The gate oxide layer 116 is grown using a low temperature process to prevent out-diffusion of the thin N-Epi layer 110.

Then, referring to FIG. 3(*f*), a polysilicon layer is deposited in the trenches and etched to form buried polysilicon gate electrode 118. In one embodiment, the deposited polysilicon layer is first planarized and then etched down to recess the polysilicon layer in the trench. After the polysilicon gate electrode 118 is formed, an ion implantation process is carried out to form the P-body region 120 at a top portion of the mesas of the P-Mesa-Epi layer 104, as shown in FIG. 3(*g*). In one embodiment, the ion implantation is an angled implant. Subsequently, another ion implantation is carried out to form the N+ source regions 122. The source regions 122 are formed in the body regions 120 and adjacent to the sidewall of the trenches. The source regions 122 extend to a depth near the top edge of the polysilicon gate electrode 118, as shown in FIG. 3(*h*). In particular, the depth of the N+ source region 122 is controlled so that the N+ source region aligns with the top edge of the polysilicon gate electrode and overlaps the gate electrode by a small amount. Finally, a third ion implantation is carried out to form the P+ body contact region 124 adjacent the source regions 122, as shown in FIG. 3(*h*).

A dielectric layer 126, such as BPSG, is deposited to cover the entire semiconductor structure. In some embodiments, the BPSG layer is planarized by a chemical mechanical polishing process and then contact openings are made in the BPSG layer 126 to expose the N+ source region 122 and the P+ body contact region 124. A metal layer is deposited and patterned to form the source electrode 130, as shown in FIG. 1. A passivation layer (not shown) is then deposited over the entire structure to passivate the NMOS transistor.

The NMOS transistor 100 of the present invention can be formed into a high density array of transistor cells. For low voltage applications, such as 30V and below, a cell pitch ($t_{cp}$) on the order of 0.8 μm, a width of the mesas (P-Mesa-Epi) on the order of 0.4 μm and a width of the N-Epi layer can be on the order of 75 nm can be used. The thin N-Epi layer combined with a high and uniform doping concentration enables NMOS transistor 100 to have a reliable breakdown voltage characteristic.

More specifically, it is well known that for effective charge balancing between the drift region and the body of the vertical MOS transistor, the thickness ratio of the N-drift region to the P-Mesa region has an inverse linear relationship with their respective doping concentrations. Furthermore, it is well known that charge balance in vertical trench MOSFET works optimally when the per area doping concentration is on the order of 1E12 cm$^{-2}$. Thus, the thickness ratio and the doping concentration ratio between the N-Epi layer 110 and the P-Mesa-Epi 104 have a relationship given as:

$$N\text{-}Epi = \text{thickness} \times N\text{-}Epi \text{ doping per cm}^3 =$$
$$0.5 \times P\text{-}Mesa\text{-}Epi \text{ thickness} \times P\text{-}Mesa\text{-}Epi \text{ doping per cm}^3 \approx$$
$$1E12\text{cm}^{-2} \text{ or } 1 \times 10^{12}\text{cm}^{-2}.$$

Note that the P-Mesa-Epi thickness refers to the horizontal dimension of the mesas and the P-Mesa-Epi thickness is halved in the above computation because there is an N-Epi layer on both sides of the P-Mesa-Epi. Half of the P-Mesa-Epi charge balances the N-Epi layer on one side, and the other half of the P-Mesa-Epi charge balances the N-Epi layer on the other side.

In one embodiment, the N-Epi layer 110 has a doping concentration per unit volume that is at least 2 times the doping concentration of the P-Mesa-Epi layer 104 to minimize doping compensation in the N-Epi layer by the p-type impurities from the P-Mesa-Epi layer. In another embodiment, an NMOS transistor with a 30V breakdown voltage is constructed using the device parameters:

| 30 V MOSFET | Width (μm) | Height (μm) | Doping Concentration and Comments |
|---|---|---|---|
| Trench | 0.20 | 2.00 | 50-200 Å Gate Oxide |
| Poly Gate | 0.16 | 0.60 | N++ In situ doped |
| P-Mesa-Epi | 0.35 | 1.75 | 5.7E16 cm$^{-3}$ |
| N-Epi | 0.075 | 2.00 | 1.33E17 cm$^{-3}$<br>42 μohms * cm$^{-2}$ |
| Gate-Drain Dielectric | 0.20 | 1.00 | SiO$_2$ |
| BPSG on top of Poly Gate | 0.20 | 0.40 | BPSG/TEOS planarized by CMP |
| Cell Pitch | 0.70 | | N-Epi resistance:<br>A * Rds = 42 μohms-cm$^{-2}$ |

In the example shown above, the per area concentration for the P-Mesa-Epi layer 104 is 1.99E12 cm$^{-2}$ (approximately 2E12 cm$^{-2}$) and the per area concentration for the N-Epi layer 110 is 9.91E11 cm$^{-2}$ (approximately 1E12 cm$^{-2}$). The per area concentration of the P-Mesa-Epi layer 104 is double the optimal 1E12 cm$^{-2}$ value because a single P-Mesa-Epi layer 104 is used to support the charge balance of two N-Epi nanotube drain drift regions formed on the P-Mesa-Epi sidewalls. Therefore, one-half of the per area doping concentration of the single P-Mesa-Epi layer 104 is used to support the charge balance of each of the two N-Epi nanotube drain drift regions.

Figure 2:
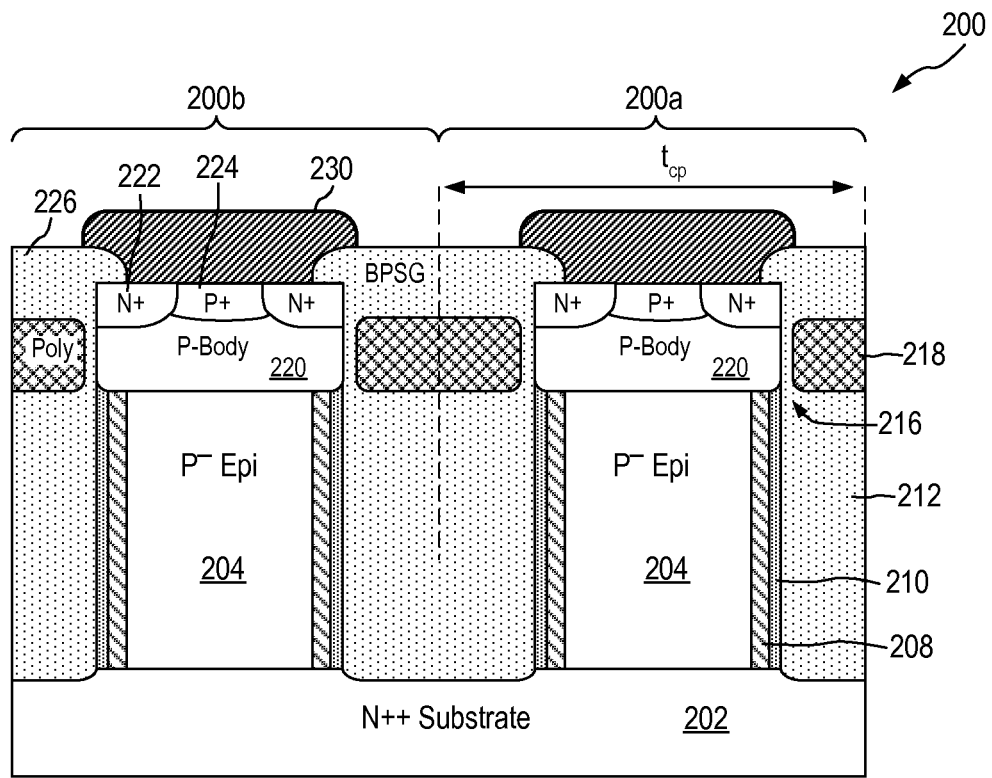
FIG. 2 is a cross-sectional view of a vertical trench MOSFET device according to a second embodiment of the present invention.
Figure 3A:
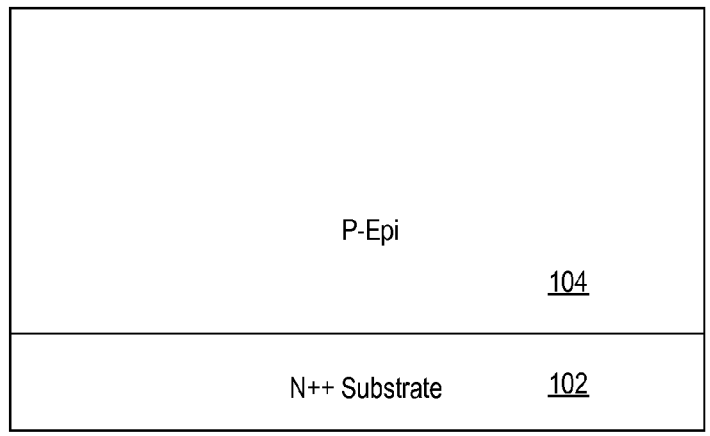
FIGS. 3(a) to 3(h) are cross-sectional views illustrating the fabrication process steps for forming the vertical trench MOSFET device of FIG. 1 according to one embodiment of the present invention.
Figure 3B:
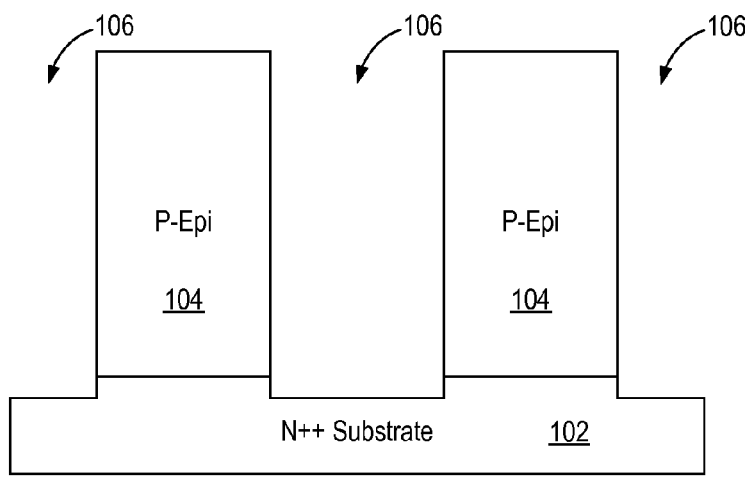
Figure 3C:
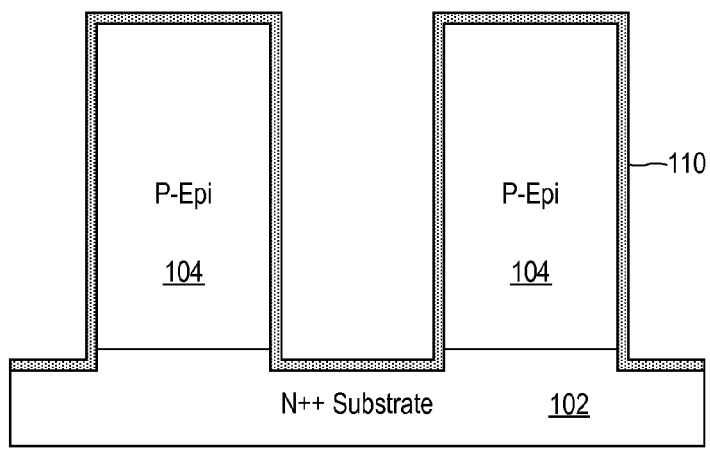
Figure 3D:
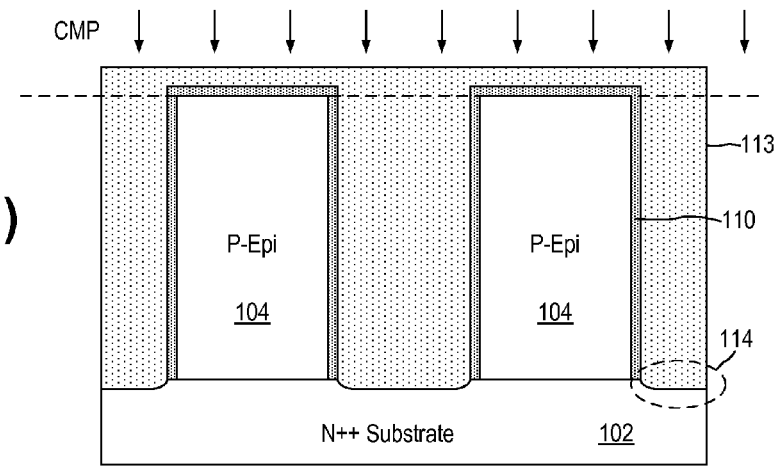
Figure 3E:
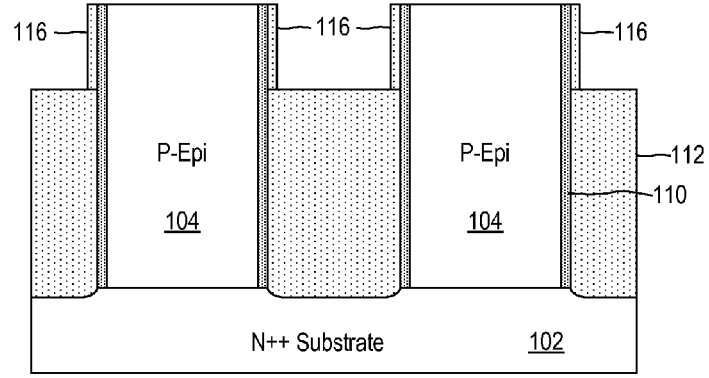
Figure 3F:
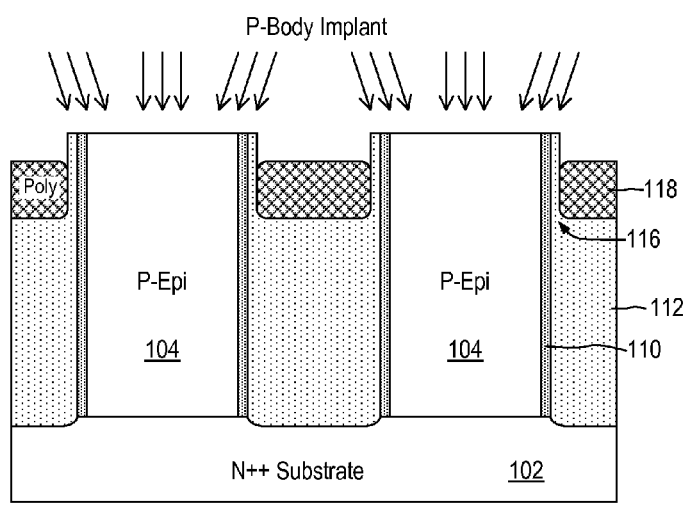
Figure 3G:
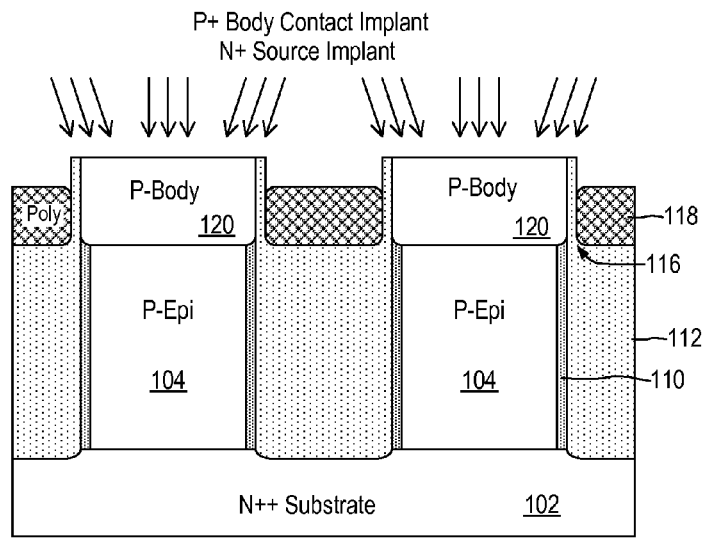
Figure 3H:
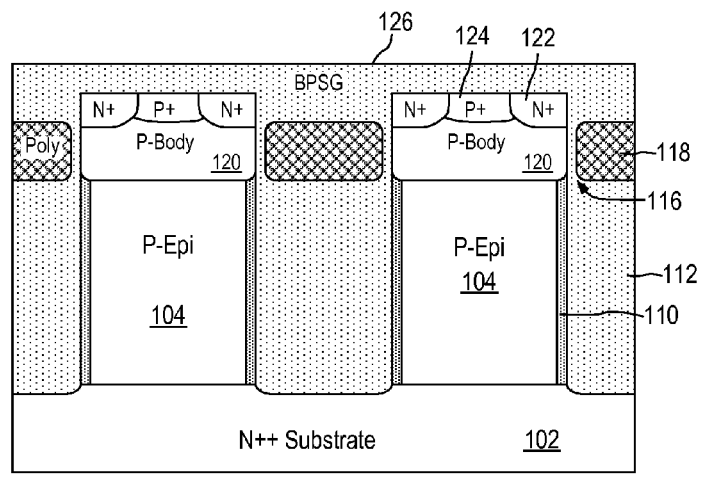

FIG. 2 is a cross-sectional view of a vertical trench MOSFET device according to a second embodiment of the present invention. Referring to FIG. 2, an N-type vertical trench MOSFET device ("NMOS transistor") 200 is formed in an array of parallely connected transistor cells 200a and 200b. A desired number of transistor cells are used to form the array to realize an NMOS transistor 200 having the desired breakdown voltage characteristic. The transistor array can be a 1-dimensional or 2-dimensional array depending on the number of transistor cells involved.

NMOS transistor 200 has the same structure as NMOS transistor 100 of FIG. 1 except for an additional thin P-type epitaxial (P-Epi) layer 208 formed adjacent to the thin N-Epi layer 210. The N-Epi layer 210 and P-Epi layer 208 forming a "double nanotube" structure. Furthermore, the P-type epitaxial layer 204 in which the transistor cells are formed is very lightly doped P-type epitaxial layer, denoted "P$^-$ Mesa Epi" in FIG. 2. The thin P-Epi layer 208 borders the N-Epi layer 210 to form parallel doped regions with uniform doping concentrations. The thin P-Epi layer 208 ensures an even electric field distribution when N-Epi layer 210 and P-Epi layer 208 are under depletion, thereby improving the breakdown voltage characteristic.

In NMOS transistor 200, the drain drift region is formed using the thin N-Epi layer 210 having a submicron to a few microns thickness and uniform doping concentration. In one embodiment, N-Epi layer 210 has a thickness of less than 1 μm. For instance, N-Epi layer 210 has a thickness of around 100 nm. Similarly, the P-Epi layer 208 has a submicron thickness and uniform doping concentration. For instance, P-Epi layer 208 has a thickness of around 250 nm. P-Epi layer 208 has a doping concentration greater than the doping concentration of the P$^-$ Mesa Epi layer 204 but less than the doping concentration of the thin N-Epi layer 210. As described above, the thickness of the nanotube epitaxial layers (N-Epi layer 210 and P-Epi layer 208) is a function of the desired breakdown voltage level for the device.

The use of thin P-Epi layer 208 to border the N-Epi drain drift region realizes advantages not achievable in the conventional transistors. When the P$^-$ Mesa Epi layer 204 is formed using conventional epitaxial processes, the P$^-$ Mesa Epi layer 204 has inherent doping concentration variations which can be on the order of 10%. The doping concentration variation is an inherent result of the epitaxial process when a thick epitaxial layer is grown. When the N-Epi drain drift region is formed directly adjacent to the P-Mesa-Epi layer, the doping concentration variation in the P-Mesa-Epi layer may result in nonuniformity in the electric field when the two regions are depleted. However, in accordance with the present invention, the N-Epi drain drift region is bordered by the thin P-Epi layer having uniform doping concentration. Because the thin P-Epi layer 208 can be grown slowly, a high degree of control over its doping concentration and thickness is achieved. Therefore, uniform electric field distribution can be assured at the P-N junction of the N-Epi layer 210 and the P-Epi layer 208 when the regions are under depletion. The P-Mesa-Epi layer 204 may be very lightly doped, so that its contribution to the charge balance is very small and the thin P-Epi layer 208 provides most of the charge in the charge balance. Thus the inherent doping variations within the P-Mesa-Epi layer 204 have negligible effects on the charge balance.

FIGS. 4(a) to 4(d) are cross-sectional views illustrating the fabrication process steps for forming the vertical trench MOSFET device of FIG. 2 using double nanotubes according to one embodiment of the present invention. The fabrication process for NMOS transistor 200 of FIG. 2 is the same as the fabrication process for NMOS transistor 100 of FIG. 1 except for the formation of the use of the lightly doped P$^-$ Mesa Epi layer 204 and the addition of the thin P-Epi layer 208. Therefore, the same processing steps as in FIGS. 3(a) to 3(h) will not be further described in detail.

Figure 4A:
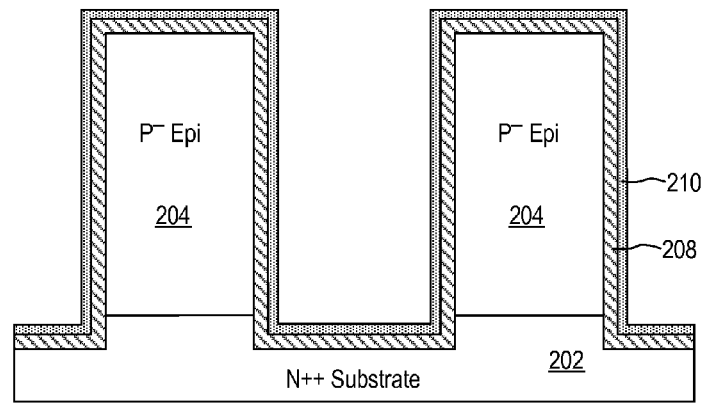
FIGS. 4(a) to 4(d) are cross-sectional views illustrating the fabrication process steps for forming the vertical trench MOSFET device of FIG. 2 according to one embodiment of the present invention.

Referring to FIG. 4(a), the lightly doped P$^-$ Mesa Epi layer 204 is formed on the N++ substrate 202 and then patterned and etched to form trenches and mesas. An epitaxial process is carried out to grow a P-type epitaxial (P-Epi) layer 208 on the exposed surfaces of the semiconductor structure. The P-Epi layer is grown on the sidewalls and the top surfaces of P$^-$ Mesa Epi layer 204 and on the exposed surface of N++ substrate 202. Then, a second epitaxial process is carried out to grow the thin N-Epi layer 210 on the exposed surfaces of the semiconductor structure. The N-Epi layer 210 is therefore grown on the P-Epi layer 208, as shown in FIG. 4(a). In an alternative embodiment, a hard mask used to etch the trenches may be left on top of P– Mesa Epi layer 204 during the epitaxial growth of P-Epi layer 208 and N-Epi layer 210 so that those layers are only grown within the trenches.

Figure 4B:
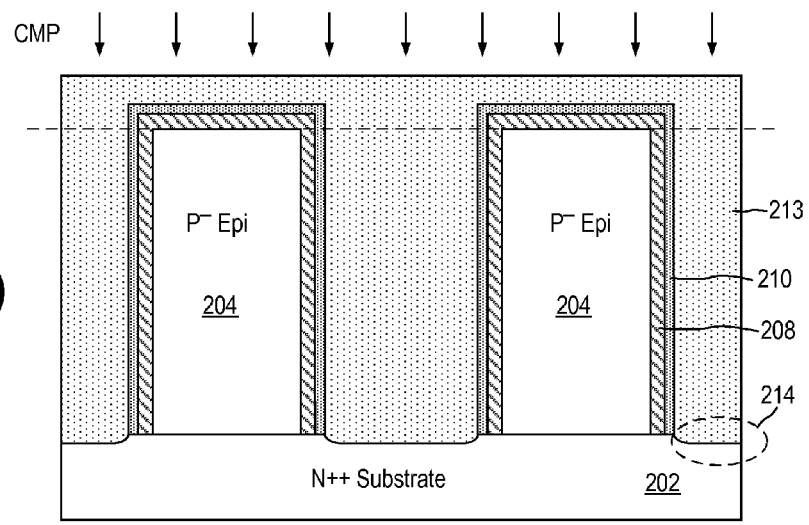

Then, an oxide layer 213 is deposited to fill the trenches, as shown in FIG. 4(b). The deposited oxide layer 213 extends to cover the mesas of the P$^-$ Mesa Epi layer 204. As the N-Epi layer 210 and P-Epi layer 208 are being formed, the portions of those layers that are formed proximate the N++ substrate 102 (denoted by dotted circle 214) are washed out and counter-doped due to out-diffusion of the very heavily doped N++ substrate 202. Subsequent to the oxide deposition, a chemical mechanical polishing (CMP) process is carried out to planarize the surface of the semiconductor structure. The CMP process removes the excess oxide and the thin N-Epi layer and the thin P-Epi layer on the top of the mesas of the P$^-$ Mesa Epi layer 204.

Figure 4C:
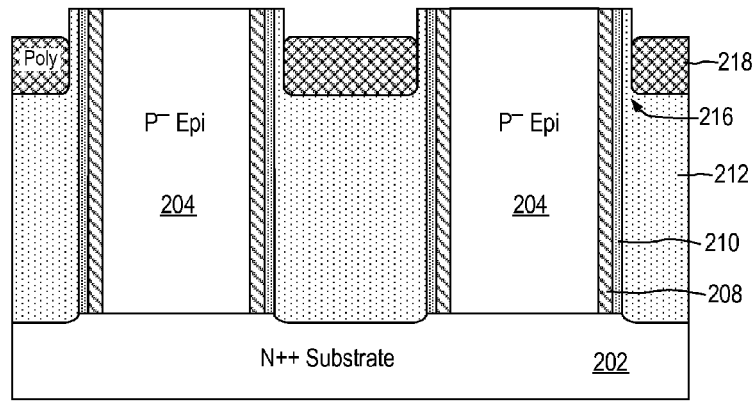

Turning now to FIG. 4(c), the oxide layer 213 is etched down to recess into the trenches, forming oxide-filed trenches 212. A gate oxide layer 216 is grown on the sidewall of the trenches and a polysilicon layer is deposited and etched down to form polysilicon gate electrodes 218. Referring to FIG.

4(d), the P-body regions 220, the N+ source regions 222 and the P+ body contact regions 224 are formed by ion implantation. The whole semiconductor structure is then covered by a dielectric layer 226, such as BPSG. The BPSG is planarized and patterned to form contact openings. Then, source electrode 230 is formed (FIG. 2) to make electrical contact with the N+ source regions 222 and P+ body contact region 224.

The doping levels of P⁻ Mesa Epi layer 204 and thin P-Epi layer 208 (the "average doping concentration") are selected to achieve a balanced space charge with the N-Epi layer 210 when the regions are depleted under reverse bias. The doping levels of P⁻ Mesa Epi layer 204 and thin P-Epi layer 208 are functions of the width of the nanotube P-Epi layer 208 and the width of the P⁻ Mesa Epi layer 204. Furthermore, as described above, there is an inverse linear relationship between the thickness ratio of N-Epi layer to the P-Epi/P⁻ Mesa Epi layer with their respective doping concentrations.

More specifically, for charge balancing, the thickness ratio and the doping concentration ratio between the N-Epi layer 210 and the P-Epi/P-Mesa-Epi 209/204 have a relationship given as:

$$N\text{-}Epi \text{ thickness} \times N\text{-}Epi \text{ doping per cm}^{-3} =$$
$$(P\text{-}Epi \text{ thickness} \times P\text{-}Epi \text{ doping per cm}^{-3}) +$$
$$(0.5 \times P\text{-}Mesa\text{-}Epi \text{ thickness} \times P\text{-}Mesa\text{-}Epi \text{ doping per cm}^{-3}) =$$
$$0.5 \times P\text{-}Epi \text{ and } P\text{-}Mesa\text{-}Epi \text{ total thickness} \times P\text{-}Epi \text{ and } P\text{-}Mesa\text{-}Epi$$
$$\text{average doping per cm}^{-3} \approx 1E12 \text{cm}^{-2} \text{ or } 1 \times 10^{12} \text{cm}^{-2}.$$

Note that the P-Mesa-Epi thickness refers to the horizontal dimension of the mesas.

In one embodiment, an NMOS transistor with a 100V breakdown voltage is constructed using the device parameters:

| 100 V MOSFET | Width (μm) | Height (μm) | Doping Concentration |
|---|---|---|---|
| Trench | 0.50 | 4.25 | 500-1000 Å Gate Oxide |
| Poly | 0.16 | 0.60 | N++ In situ doped |
| P-Mesa-Epi | 0.50 | 4.00 | 5E14 cm⁻³ (or 0.25E11 cm⁻² per area concentration for two nanotube N-Epi drain regions) |
| P-Epi | 0.25 | 4.00 | 3.95E16 cm⁻³ (or 0.9875E12 cm⁻² per area concentration) |
| N-Epi | 0.125 | 4.00 | 8E16 cm⁻³ 42 μohms * cm⁻² |
| Gate-Drain Dielectric | 0.20 | 1.00 | SiO₂ |
| BPSG on top of Poly Gate | 0.20 | 0.40 | BPSG/TEOS planarized by CMP |
| Cell Pitch | 1.75 | | N-Epi resistance: A * Repi= 225 μohms-cm⁻²; P- Epi and P-Epi nanotube resistance same as N-Epi resistance |

In one embodiment, an NMOS transistor with a 200V breakdown voltage is constructed using the device parameters:

| 200 V MOSFET | Width (μm) | Height (μm) | Doping Concentration Comments |
|---|---|---|---|
| Trench | 0.50 | 8.25 | 500-1000 Å Gate Oxide |
| Poly | 0.16 | 0.60 | N ++ In situ doped |
| P-Mesa-Epi | 0.50 | 8.00 | 5E14 cm⁻³ (or 0.25E11 cm⁻² per area concentration for two nanotube N-Epi drain regions) |
| P-Epi | 0.25 | 8.00 | 3.95E16 cm⁻³ (or 0.9875E12 cm⁻² per area concentration) |
| N-Epi | 0.125 | 8.00 | 8E16 cm⁻³ 42 μohms * cm⁻² |
| Gate-Drain Dielectric | 0.20 | 1.00 | SiO₂ |
| BPSG on top of Poly Gate | 0.20 | 0.40 | BPSG/TEOS planarized by CMP |
| Cell Pitch | 1.75 | | N-Epi resistance: A * Repi = 225 μohms-cm⁻² P- Epi and P-Epi nanotube resistance same as N-Epi resistance |

Figure 5:
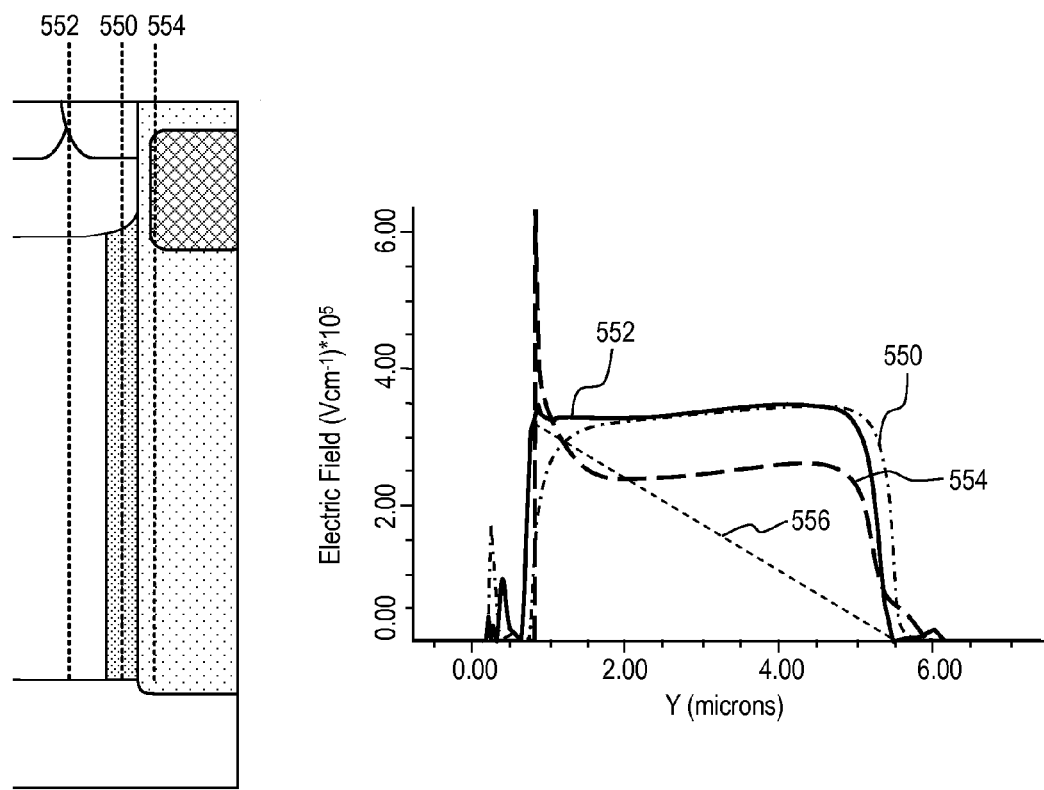
FIG. 5 is a simulation result showing the distribution of the electric field along the nanotube drain drift region of the NMOS transistor of FIG. 1 under depletion.

FIG. 5 is a simulation result showing the distribution of the electric field along the nanotube drain drift region of the NMOS transistor 100 of FIG. 1 under depletion. Referring to FIG. 5, line 550 represents the electric field distribution along the length of the nanotube drain drift region and line 552 represents the electric field distribution in the P-Mesa-Epi layer when both regions are in depletion. Line 554 represents the electric field distribution along the polysilicon gate and the oxide filled trench. As shown in FIG. 5, because the nanotube drain drift region has a uniform doping concentration distribution, the electric field is uniformly distributed over the entire length of the N-Epi nanotube which yields an improved breakdown voltage characteristic. In the conventional NMOS transistor, there is no deep oxide under the gate, nor charge balance in the drift region. In that case, the electric field distribution will become graded, as shown by dotted line 556 in FIG. 5. Gradient in the electric field tends to negatively affect the breakdown voltage characteristic of the transistor.

Other Semiconductor Devices

According to other aspects of the present invention, the N-Epi/P-Epi nanotube transistor structure described above is applied to form other semiconductor devices. In one embodiment, the N-Epi/P-Epi nanotube transistor structure is applied to form an insulated gate bipolar transistor (IGBT) device. In another embodiment, the N-Epi/P-Epi nanotube transistor structure is applied to form a Schottky diode. In yet another embodiment, the N-Epi/P-Epi nanotube transistor structure is applied to form a P-N junction diode. The IGBT device, Schottky diode and P-N junction diode can be formed using the single nanotube structure as shown in FIG. 1 or the double nanotube structure as shown in FIG. 2. A gate electrode is not needed in the trenches of semiconductor cells used to form diode devices.

Furthermore, in one embodiment of the present invention, an NMOS transistor is formed using an array of transistor cells, such as the transistor cells in FIGS. 1 and 2, and the array of transistor cells is interposed with one or more of the IGBT devices, or the Schottky diodes or the P-N junction diodes, or any combination of these devices, constructed using the same N-Epi/P-Epi nanotube transistor structure. As thus constructed, the vertical NMOS or PMOS transistors are connected in parallel with the IGBT devices, the Schottky diodes and/or the P-N junction diodes. Connecting IGBT devices, Schottky diodes and/or P-N junction diodes in parallel with the vertical trench MOSFET realizes specific advantages to the device operation, as will be described in more detail below.

Figures 6, 6A:
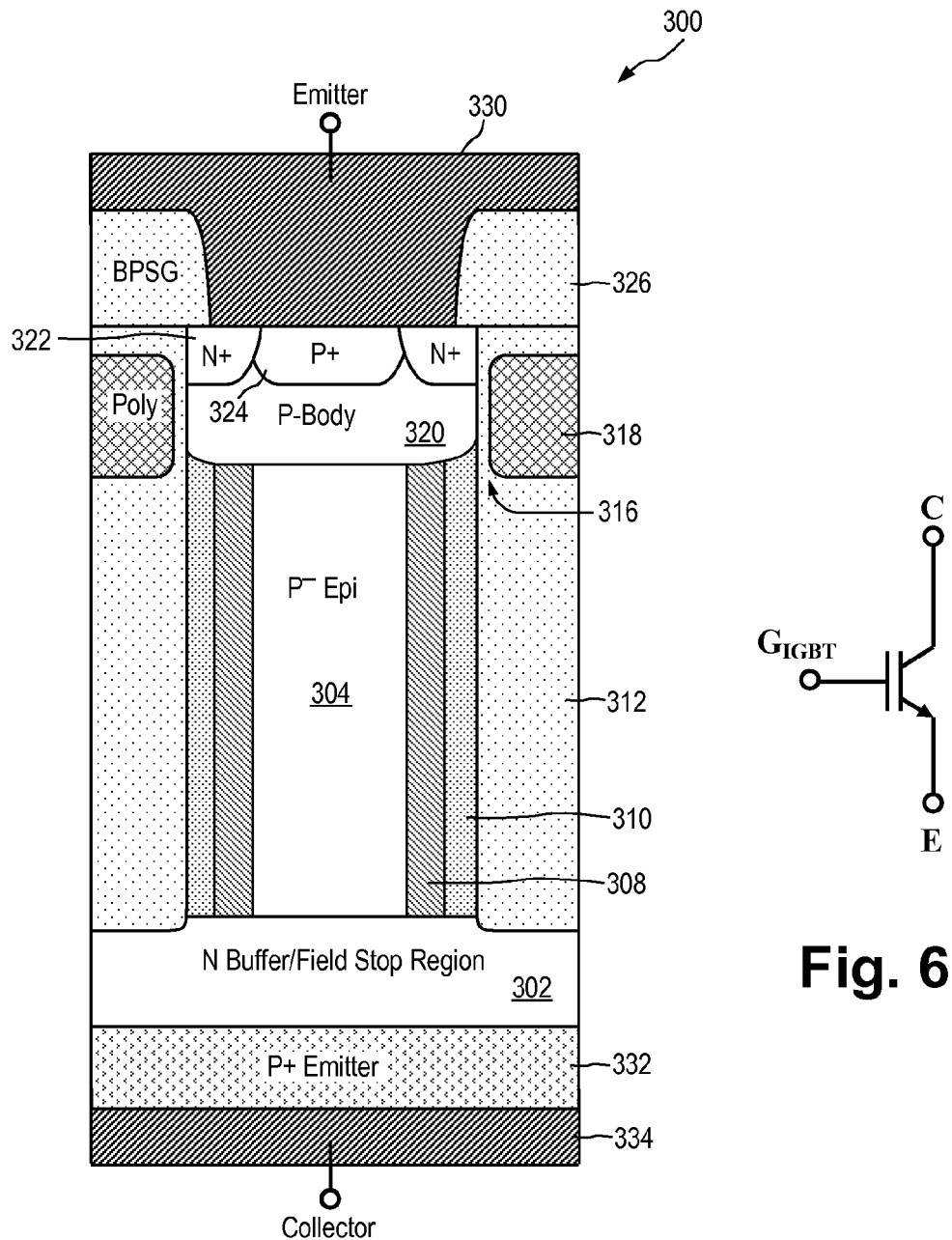
FIG. 6 is a cross-sectional view of an insulated gate bipolar transistor (IGBT) device according to one embodiment of the present invention.
FIG. 6(a) illustrates the circuit symbol of an IGBT device.

FIG. 6 is a cross-sectional view of an insulated gate bipolar transistor (IGBT) device according to one embodiment of the present invention. Referring to FIG. 6, an IGBT device 300 is formed on an N-type buffer layer 302 functioning as the field stop region. In one embodiment, N-buffer layer 302 is formed either by epitaxial growth or using backside implant and has a thickness of 2-15 microns. N-buffer layer 302 can also be the starting substrate. A P-type semiconductor layer is formed on the bottom surface of N buffer layer 302 to form the P+ internal emitter region 332. A metal layer 334 is provided to form a collector electrode for making electrical contact to the P+ internal emitter region 332. It is understood that the internal emitter of an IGBT is designated as the collector in the external device terminal nomenclature, as shown in FIG. 6(a). The remaining N-Epi/P-Epi nanotube NMOS transistor is formed in the same manner as described with reference to FIG. 2. A gate polysilicon electrode 318 is found in the oxide-filled trench 312 and adjacent to gate dielectric 316. N-Epi layer 310, and P-Epi layer 308 are formed on the sidewalls of the trenches. The P-body region 320 serves as the internal collector of the IGBT device 300. Metal layer 330 forms an emitter electrode for making electrical contact to P+ contact region 324 of the P-Body internal collector 320 and for making contact to the N+ source regions 322 through BPSG 326. It is understood that the internal collector of an IGBT is designated as the emitter in the external device terminal nomenclature, as shown in FIG. 6(a).

Connecting IGBT devices in parallel with the MOSFET device in a transistor array provides many advantages. First, nanotube IGBT devices are desirable in high switching frequency applications. Second, by integrating IGBT and MOSFET in a common array formed using the same fabrication process, the size of the passive components and the system cost will be reduced and the overall system power dissipation will also be reduced. Furthermore, the N-Epi nanotube layer forming the base region of the IGBT device is relatively heavily doped (e.g., 2 orders of magnitude) as compared to IGBT devices formed using conventional processes. Thus, less charge will be stored in the base region and minority carrier life time will be shorter. The IGBT device constructed using the N-Epi/P-Epi nanotube fabrication process of the present invention will have lower collector-to-emitter voltage Vice and thus lower conduction loses and faster switching speed. Of course, in other embodiments, the IGBT device could also be formed by itself on a semiconductor substrate, without MOSFETs or other devices.

Figures 7, 7A:
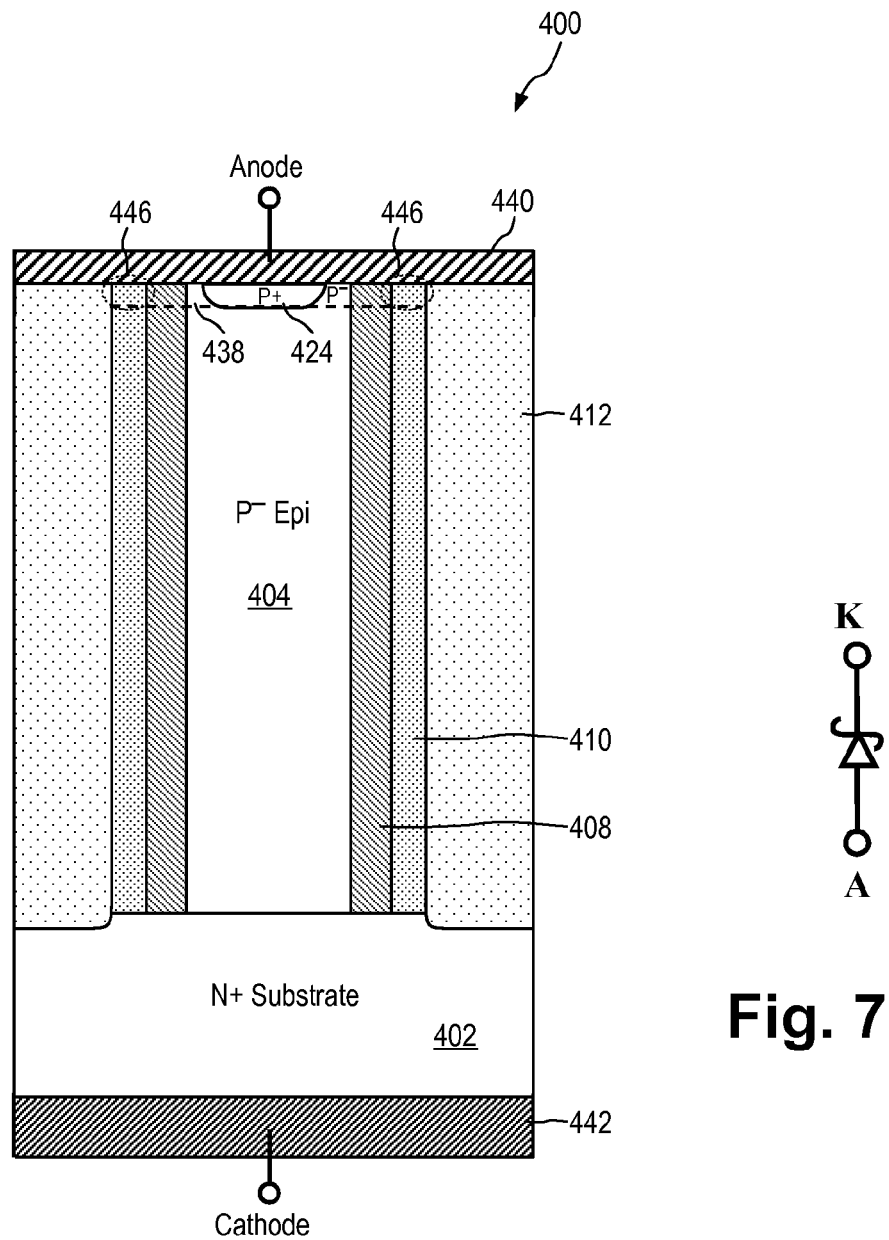
FIG. 7 is a cross-sectional view of a Schottky diode according to one embodiment of the present invention.
FIG. 7(a) illustrates the circuit symbol of a Schottky diode.

FIG. 7 is a cross-sectional view of a Schottky diode according to one embodiment of the present invention. Referring to FIG. 7, Schottky diode 400 is formed on an N+ substrate 402. A metal layer 442 is provided to make electrical contact to the N+ substrate 402 to form the cathode electrode. The remaining N-Epi/P-Epi nanotube NMOS transistor is formed in the same manner as described with reference to FIG. 2, however, the polysilicon gate electrode, the body region, the source region and the body contact region are not formed. Instead, a shallow P+ anode contact region 424 is formed in the P⁻ Mesa Epi layer 404. The P+ anode contact region 424 is heavily doped to ensure ohmic contact in this region. A Schottky metal layer 440 is deposited on the top of the semiconductor structure and is in contact with at least the N-Epi layer 410, the P-Epi layer 408 and the P⁻ Mesa Epi layer 404, and P+ anode contact region 424. At the junction 446 between the Schottky metal layer 440 and the N-Epi layer 410, a Schottky junction is formed. The Schottky metal layer 440 forms the anode electrode of the Schottky diode 400. FIG. 7(a) illustrates the circuit symbol of the Schottky diode. In an alternate embodiment, before Schottky metal deposition, a p-type implant, such as Boron (B) or BF2, is introduced to the top surface of the P⁻ Mesa Epi layer 404 to form a shallow, lightly doped P⁻ doped region 438. P⁻ doped region 438 extends across the entire surface of the mesa, including the N-Epi layer 410 and the P-Epi layer 408. P⁻ doped region 438 has the function of reducing the N-Epi surface concentration in order to adjust the Schottky barrier height so as to reduce leakage current during off state of the Schottky diode, and to ensure good Schottky contact.

In another embodiment, an NMOS transistor is formed using an array of transistor cells, such as the transistor cells in FIGS. 1 and 2, and the array of transistor cells is interposed with Schottky diode devices constructed using the same N-Epi/P-Epi nanotube transistor structure. The Schottky diode devices interposed in the transistor array have the function of improving the recovery of the transistor. In one embodiment, 10% of the transistor cells are formed as Schottky diodes.

Figures 8, 8A:
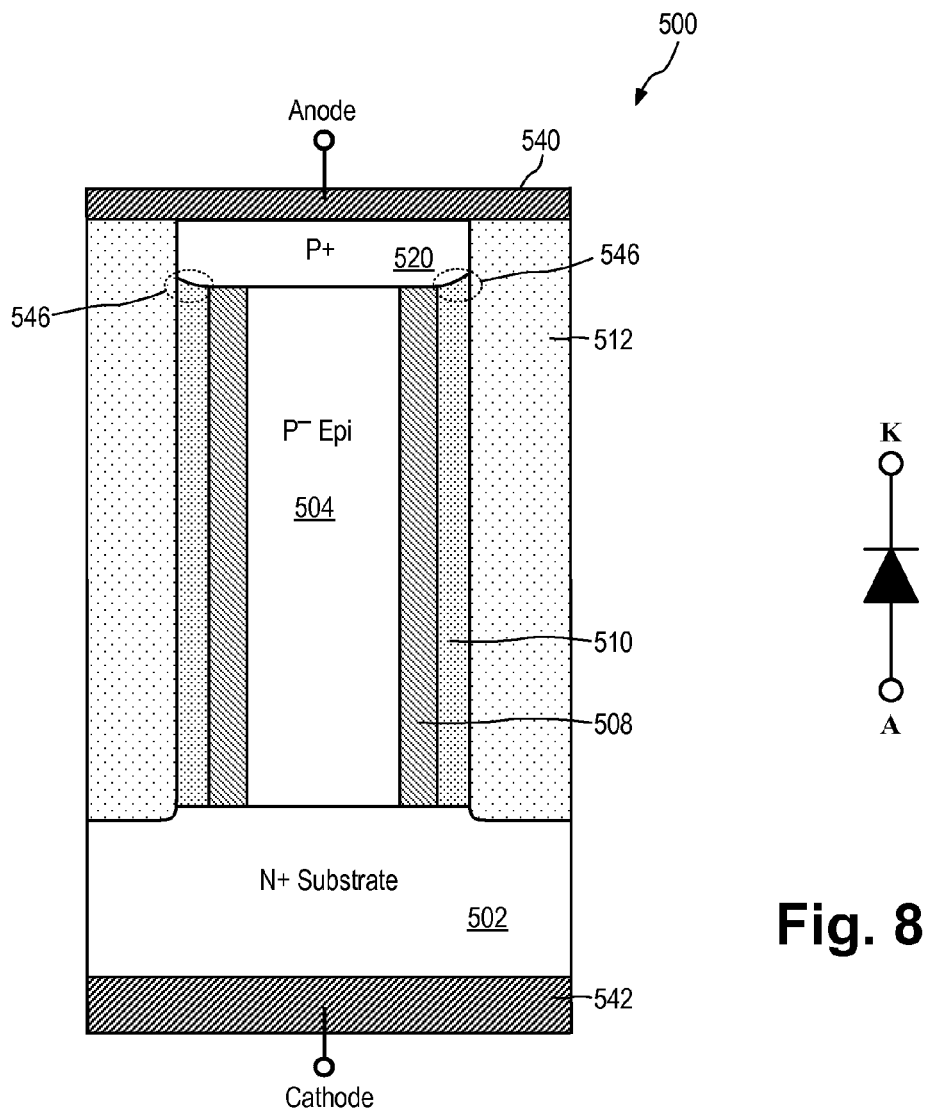
FIG. 8 is a cross-sectional view of a P-N junction diode according to one embodiment of the present invention.
FIG. 8(a) illustrates the circuit symbol of a P-N junction diode.

FIG. 8 is a cross-sectional view of a P-N junction diode according to one embodiment of the present invention. Referring to FIG. 8, P-N junction diode 500 is formed on an N+ substrate 502. A metal layer 542 is provided to make electrical contact to the N+ substrate 502 to form the cathode electrode. The remaining N-Epi/P-Epi nanotube NMOS transistor is formed in the same manner as described with reference to FIG. 2, however, the polysilicon gate electrode, the source region and the body contact region are not formed. Instead, a P+ anode contact region 520 is formed in the P⁻ Mesa Epi layer 504. An ohmic metal layer 540 is deposited on the top of the semiconductor structure and is in contact with the P+ anode contact region 520 to form the anode electrode. At the junction 546 between the P+ anode contact region 520 and the N-Epi layer 510, a P-N junction is formed. FIG. 8(a) illustrates the circuit symbol of the P-N junction diode 500. As thus configured, P-N junction diode 500 is constructed using the same N-Epi/P-Epi nanotube transistor fabrication process and can be formed in an array together with the NMOS or PMOS transistors using the same fabrication process. Integrating a P-N junction diode with vertical trench MOSFET devices in the same transistor array allow the use of external diode to be eliminated, thereby saving cost and improving performance.

In FIGS. 6-8, the IGBT device, Schottky diode and P-N junction diode are formed using the double nanotube structure. In other embodiments, the same IGBT device, Schottky diode and P-N junction diode can be formed using a single N-Epi nanotube.

Fabrication Processes Using P-Type Substrate

According to another aspect of the present invention, a method for fabricating a vertical trench MOSFET device including thin N-Epi and P-Epi layers ("nanotubes") uses a lightly doped P-type single crystalline substrate as the body of the device. The backside layers of the vertical trench MOSFET devices are formed either by epitaxial growth or by ion implantation. Furthermore, the same fabrication process can be used to form IGBT devices, Schottky diodes, and P-N junction diodes, alone or in combination with each other. More importantly, the same fabrication process can be used to form vertical trench MOSFET transistor cells in combination with one or more of the IGBT, Schottky diodes, and P-N junction diodes to realize parallely connected structures to enhance the electrical characteristics of the power MOSFET device.

Figure 9A:
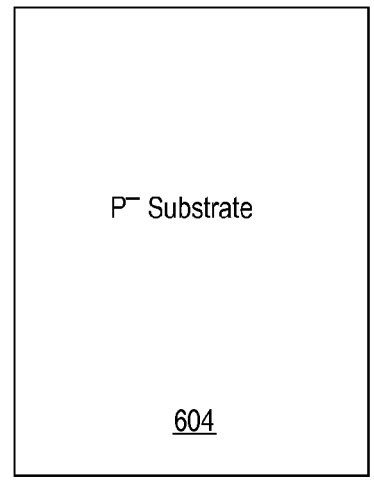
FIGS. 9(a) to 9(k) are cross-sectional views illustrating fabrication process steps for forming a vertical trench MOSFET device and an IGBT device according to an alternate embodiment of the present invention.
Figure 9B:
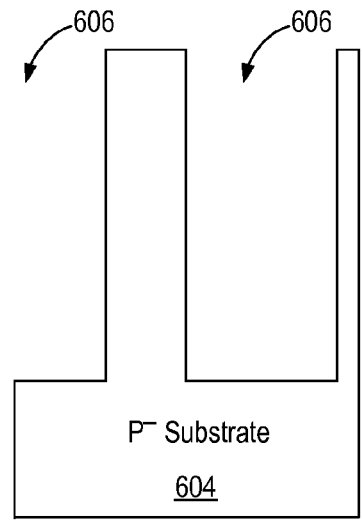

FIGS. 9(a) to 9(k) and 9(f1) to 9(h1) and 9(j1) to 9(l1) are cross-sectional views illustrating fabrication process steps for forming a vertical trench MOSFET device and an IGBT device according to alternate embodiments of the present invention. Referring to first FIG. 9(a), the method for fabricating a vertical trench MOSFET device uses a P-type single crystalline silicon substrate (P⁻ substrate) 604 as the starting material. In one embodiment, P⁻ substrate 604 has a doping concentration of 1E14 to 1E15 cm⁻³. P⁻ substrate 604 is etched to form trenches 606, as shown in FIG. 9(b). The vertical trench MOSFET or other devices are formed in mesas of P⁻ substrate 604 ("P⁻ mesa substrate") without using epitaxial growth as in the fabrication process described above.

Figure 9C:
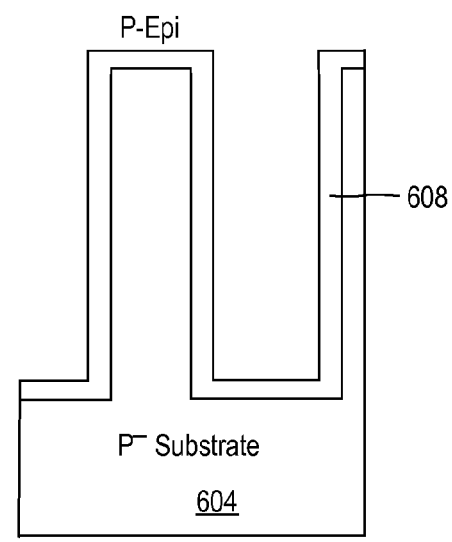
Figure 9D:
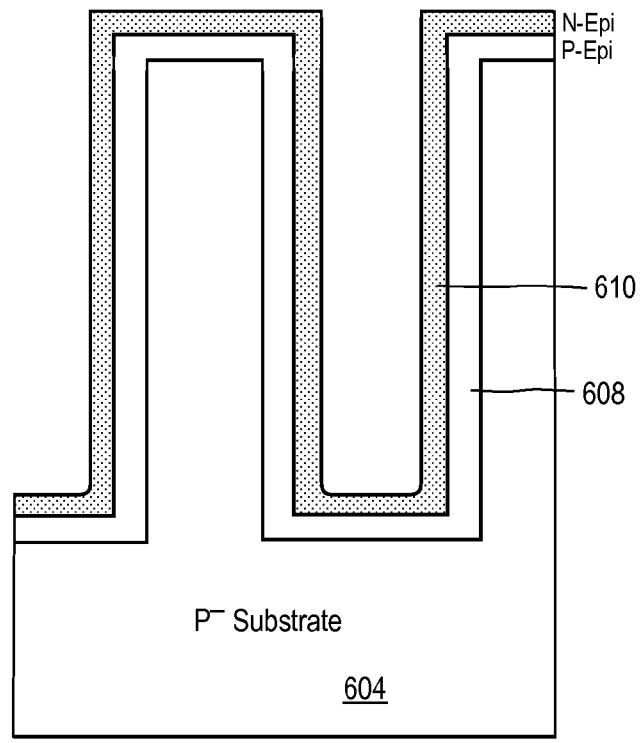

Referring now to FIG. 9(c), an epitaxial process is carried out to form a P-Epi layer 608 on the surface of P⁻ substrate 604. P-Epi layer 608 is formed conformally on the exposed surfaces of the P⁻ substrate 604, in the trenches and on the top and bottom surfaces. Then, a second epitaxial process is carried out to form N-Epi layer 610 on the surface of P-Epi layer 608, as shown in FIG. 9(d). N-Epi layer 610 is formed conformally on conformal P-Epi layer 608.

Figure 4D:
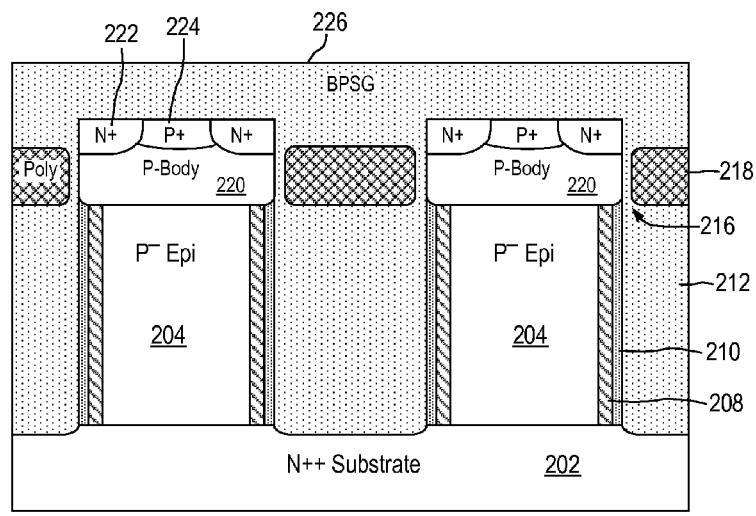
Figure 9E:
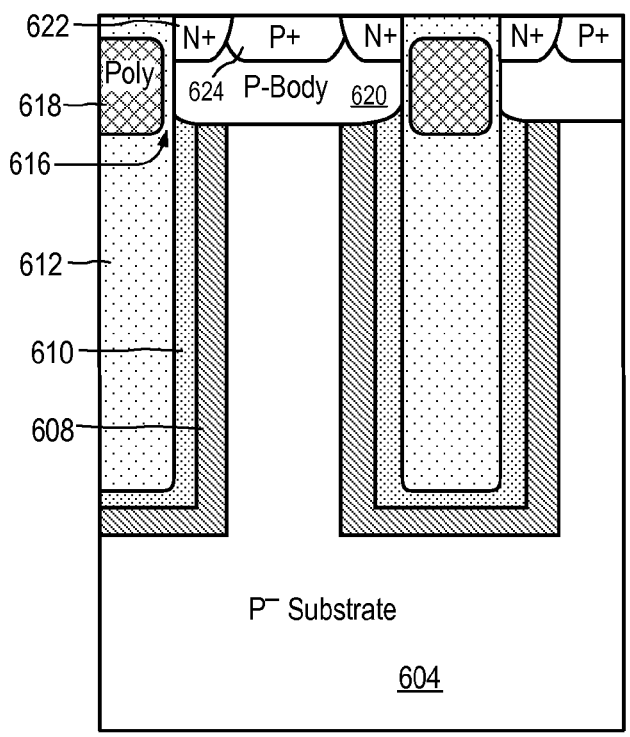

Then, subsequent processing steps, similar to the processing steps described in FIGS. 4(b) to 4(d) are carried out to complete the transistor structure at the top surface of P mesa substrate 604, as shown in FIG. 9(e). More specifically, trenches 606 are filled with a dielectric material, such as silicon dioxide 612, and etched back. A polysilicon layer 618 is formed in the trenches to form the gate terminal adjacent a gate dielectric 616. Doped regions are then formed at the top surface of P⁻ mesa substrate 604. A P-Body region 620 is formed. Heavily doped N+ source regions 622 and a heavily doped P+ body contact region 624 are formed in the P-body region 620.

Then, in the present embodiment, the fabrication process continues to complete the topside processing. That is, referring to FIG. 9(f), an insulating layer, such as BPSG 626, is formed over the entire surface of the semiconductor structure. Openings are made in BPSG layer 626 and a metal layer 630 is deposited to make contact with the N+ source regions 622 and P+ body contact region 624. Metal layer 630 forms the source or emitter electrode depending on the type of device being built based on the bottomside processing. In an alternate embodiment, the topside processing is left unfinished while the bottomside processing is carried out, as will be described in more detail below.

Figure 9F:
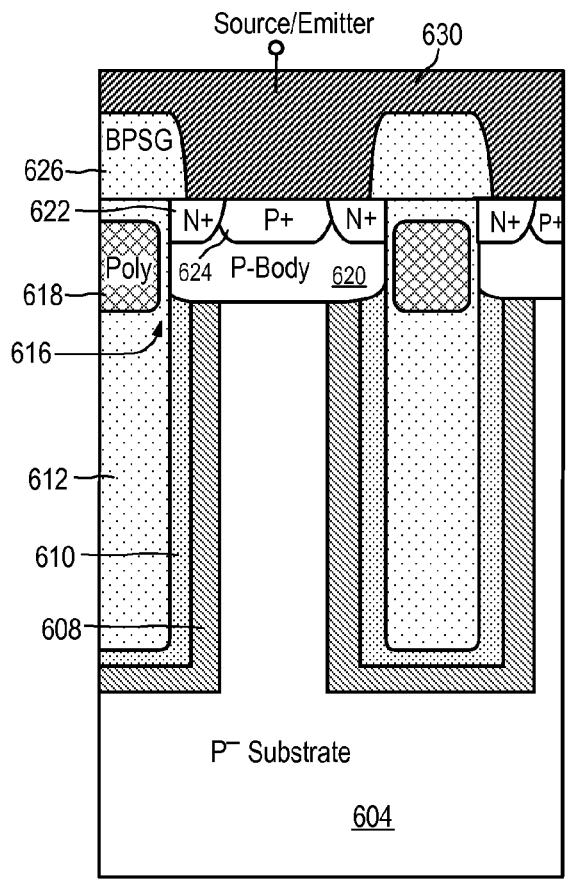
Figure 9G:
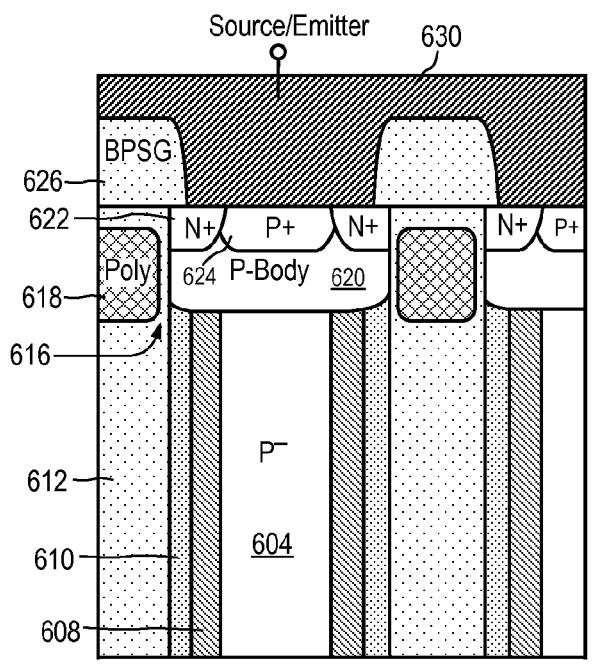

In the present embodiment, after the topside processing is completed, the semiconductor structure is subjected to back grinding to remove the excess P⁻ substrate materials from the bottom, as shown in FIG. 9(g). The back grinding is carried out up to the bottom of the oxide filled trenches, that is, up to the bottom surface of oxide layer 612. Thus, the excess N-type and P-type epitaxial layers at the bottom of the trenches are removed.

Figure 9H:
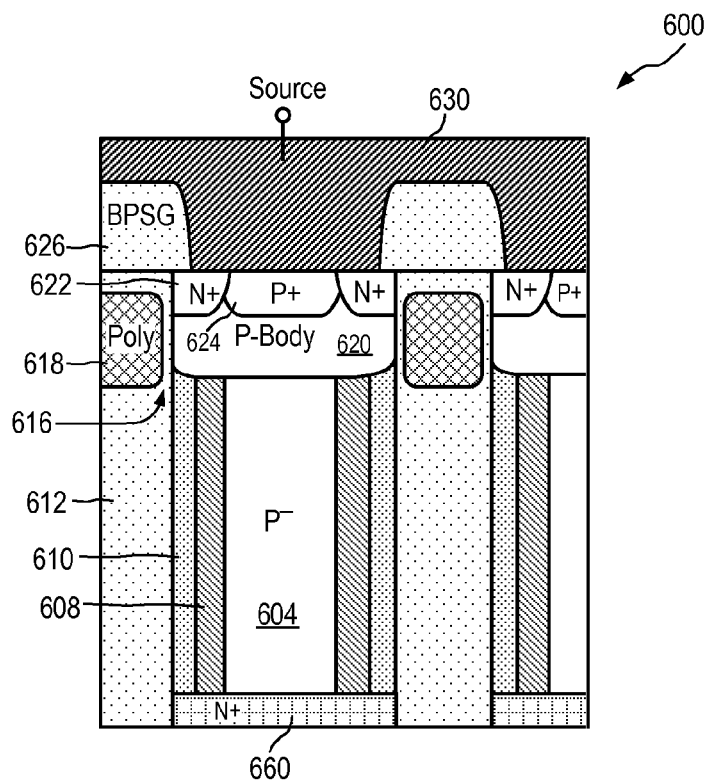
Figure 9I:
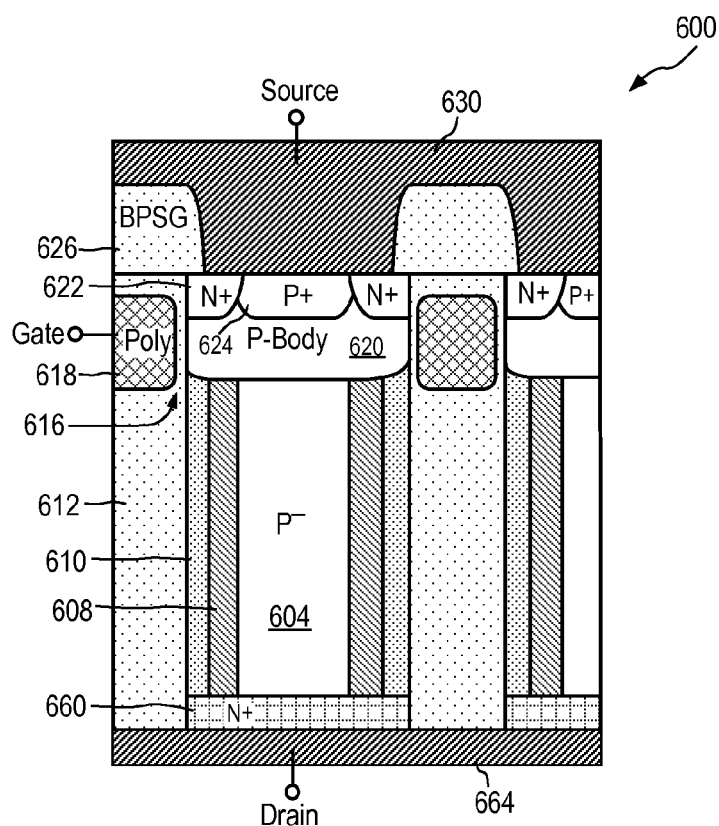

After the back grinding process, an implantation process (e.g., ion implantation or diffusion) is applied to the back-side to form an N+ doped layer 660 at the bottom of the P⁻ mesa 604, as shown in FIG. 9(h). As thus constructed, a vertical NMOS transistor 600 is formed with the N+ doped layer 660 as the drain, the N-Epi layer 610 as the nanotube drain drift region, N+ region 622 as the source and polysilicon layer 618 as the gate. In other embodiments, N+ layer 660 is used as the ohmic contact to the cathode of a Schottky or P-N Junction diode. After localized implant activation by Rapid Thermal Anneal (RTP) or Laser annealing, bottom metallization 664 is applied to form a drain electrode at the bottom of the semiconductor structure, as shown in FIG. 9(i). In one embodiment, the backside metallization is sputtered on and the sputtered metal can be a metal selected from Titanium, Nickel or Gold.

Figure 9J:
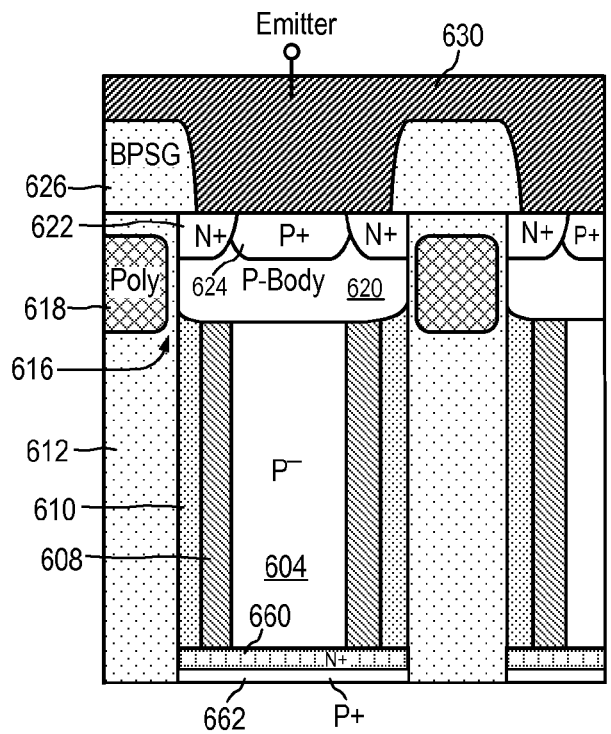
Figure 9K:
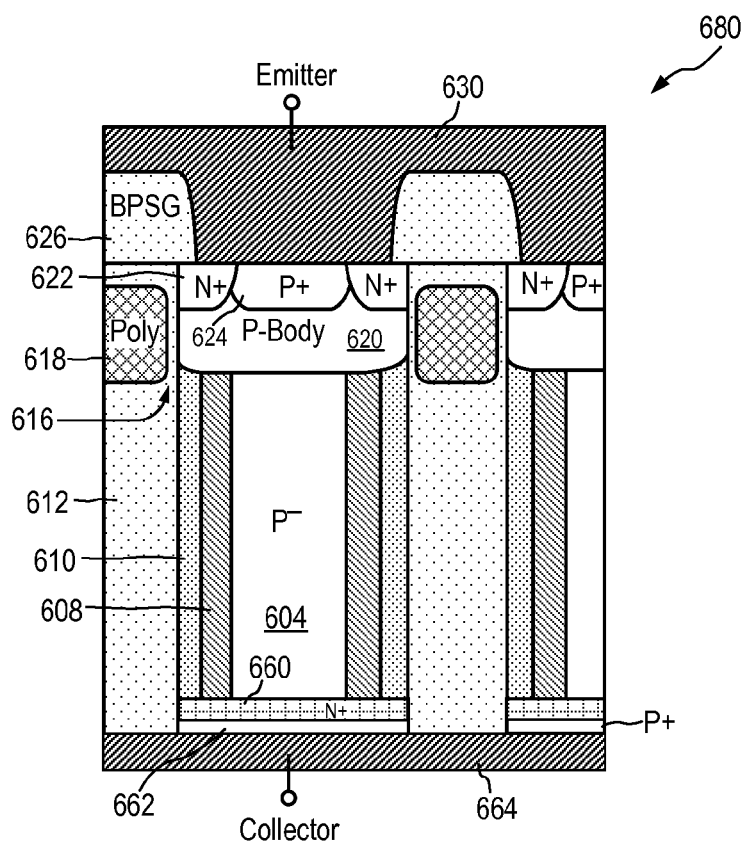

In yet another embodiment, an IGBT device is formed using the same vertical trench MOSFET structure including N-type and P-type nanotubes. After the backside N+ implantation to form N+ layer 660 as shown in FIG. 9(h), another backside implantation is carried out to form a P+ doped layer 662 where the IGBT device is desired, as shown in FIG. 9(j). N+ doped layer 660 forms the N-buffer layer or field stop region for the IGBT while P+ doped layer 662 forms the P+ internal emitter of the IGBT. The P+ implantation can be blanket to make all vertical trench MOSFET structures into IGBT devices or selective to make certain semiconductor structures IGBT devices. Bottom metallization 664 is applied to form a collector electrode to the P+ internal emitter 662, as shown in FIG. 9(k). An IGBT device 680 is thus formed using the same fabrication process steps as NMOS transistor 600 except with the addition of the P+ layer 662 through backside implantation. The P-body region 620 serves as the internal collector of the IGBT device 680. The top metallization 630 forms the emitter electrode contacting the P-Body internal collector region 620.

Figure 9:
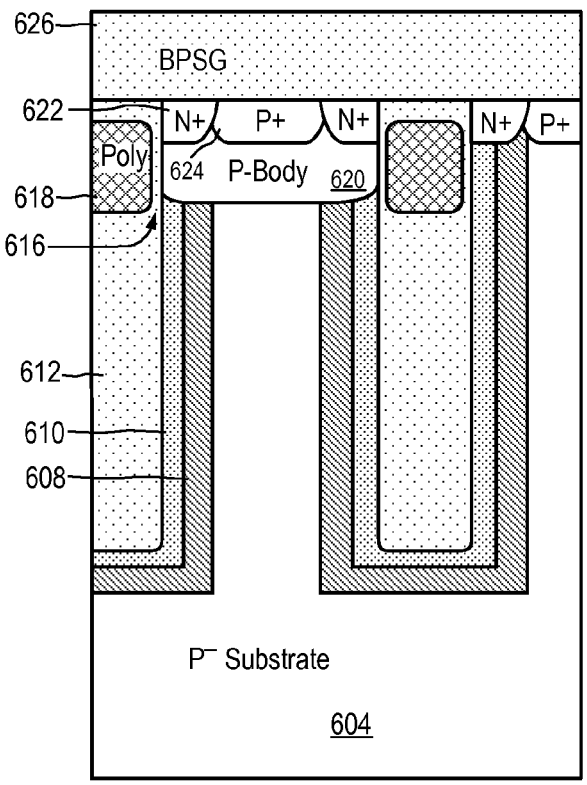
FIGS. 9(f1) to 9(h1) and 9(j1) to 9(l1) are cross-sectional views illustrating fabrication process steps for forming a vertical trench MOSFET device and an IGBT device according to an alternate embodiment of the present invention.
Figure 9:
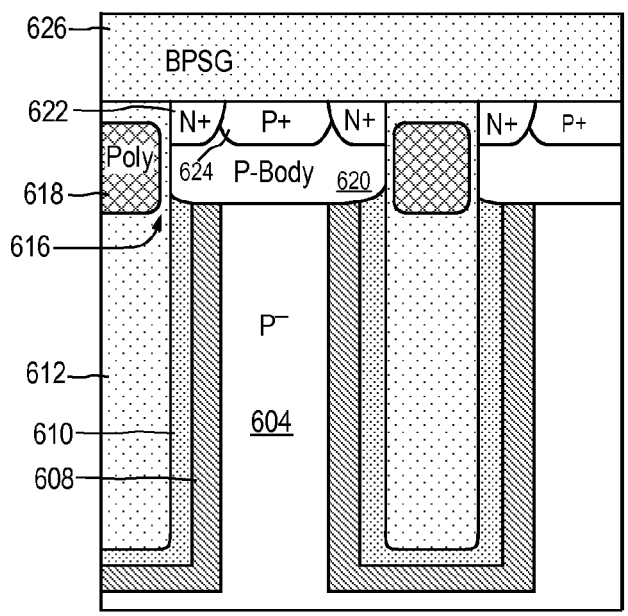
Figure 9:
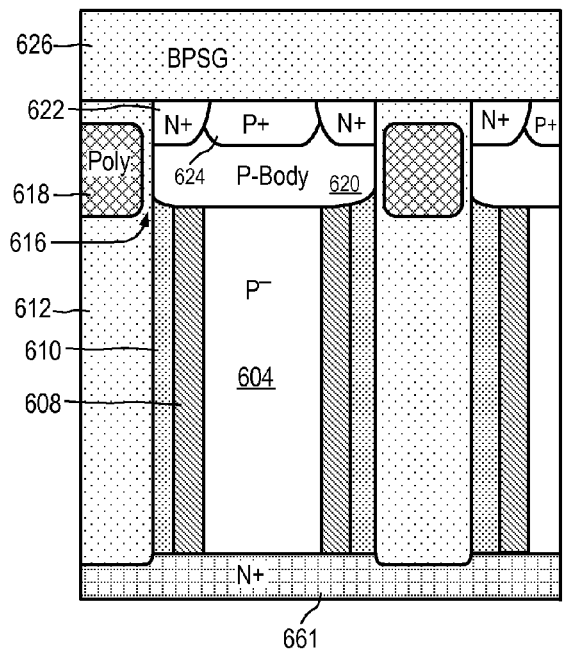
Figure 9:
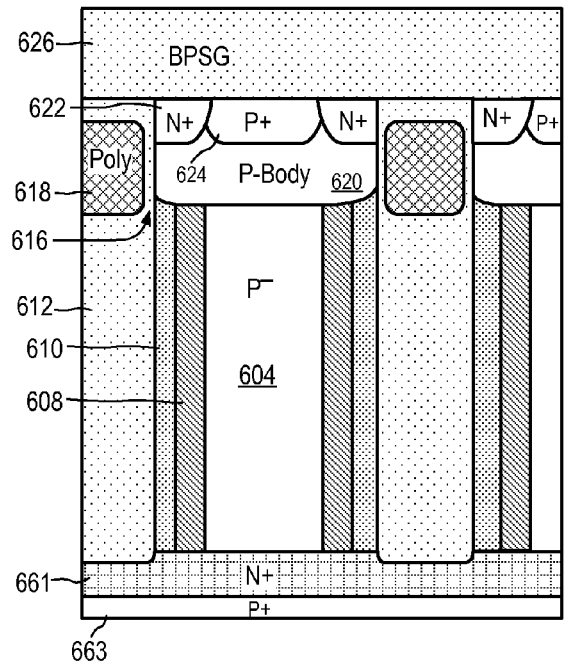
Figure 9:
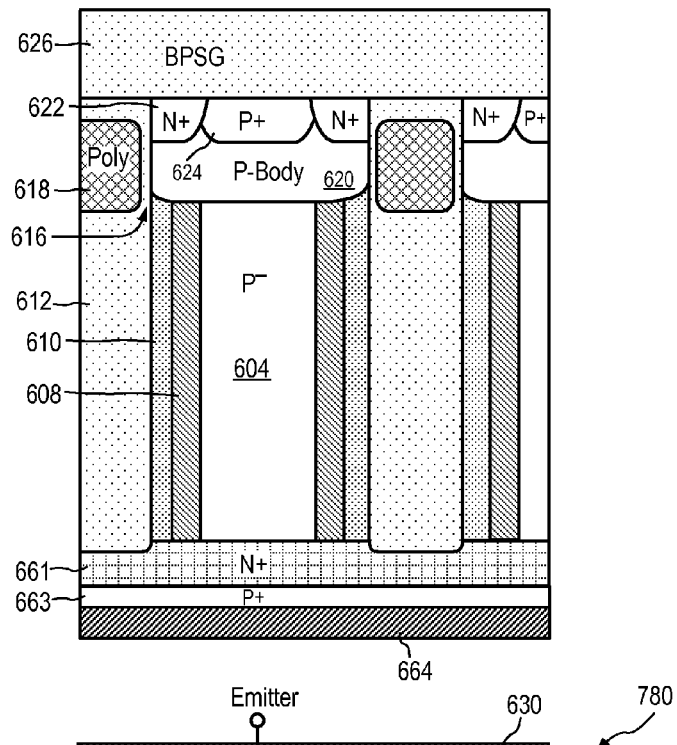
Figure 9:
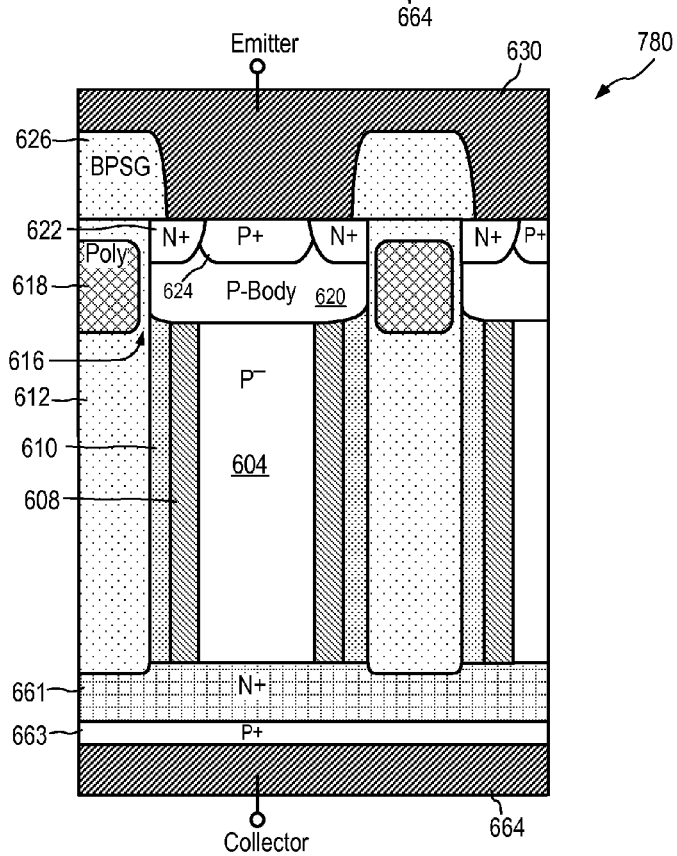

As described above, after the transistor structure at the top of the P⁻ mesa 604 is formed as shown in FIG. 9(e), the topside processing can be completed as shown in FIG. 9(f) before back grinding or the topside processing is left unfinished while the bottomside processing is carried out. FIGS. 9(f1) to 9(h1) and 9(j1) to 9(l1) illustrate alternative processing steps which can be used to form the vertical trench MOSFET and other devices using the lightly doped P-type single crystalline substrate. Referring to FIG. 9(f1), subsequent to FIG. 9(e), a BPSG layer 626 is formed to cover the entire top surface of the semiconductor structure. Then, before any further topside processing is performed, backside grinding is carried out to grind the excess P⁻ substrate to a point close to the bottom of the oxide-filled trenches, as shown in FIG. 9(g1). The BPSG layer 626 protects the topside of the MOSFET device during the backside processing steps. In one embodiment, the backside grinding is carried out up to a point about 2-5 microns under the trench. That is, a layer of P⁻ substrate 604 of about 2-5 microns remains under the trenches after the backside grinding process. The remaining P⁻ substrate on the bottom surface is critical when the use of epitaxial growth to form the N+ and P+ layers on the backside is desired.

Referring to FIG. 9(h1), an N+ layer 661 is formed on the backside by epitaxial growth or by ion implantation. Out-diffusion of dopants from the N+ layer 661 will counter-dope the N-Epi and P-Epi layers formed at the bottom of the trenches to form the N+ layer as shown in FIG. 9(h1). When a vertical NMOS transistor is to be formed, bottom metallization is applied directly to the N+ layer 661. However, when an IGBT device is to be formed, then a P+ layer 663 is formed on the backside by epitaxial growth or by ion implantation, as shown in FIG. 9(j1). In particular, if the P+ layer 663 is to be grown, then it is preferred for the top side to be covered by a BPSG layer instead of having exposed metallization because of contamination issues from the top metal during the epitaxial growth process.

When an IGBT device is to be formed, backside metallization 664 is applied after the P+ layer 663 is formed, as shown in FIG. 9(k1). Then, topside processing is carried out to form openings in the BPSG layer 626 and to form the top side metallization 630, as shown in FIG. 9(l1). As thus constructed, an IGBT device 780 is formed with the topside metallization 630 serving as the emitter electrode and the bottomside metallization 664 as the collector electrode.

Figure 10:
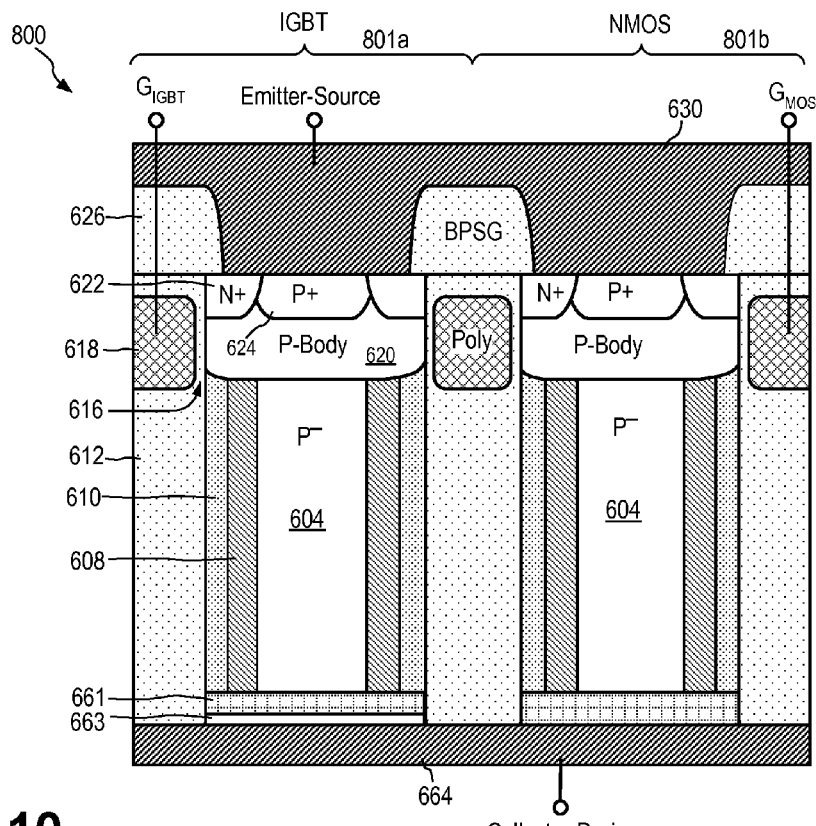
FIG. 10 is a cross-sectional view of a vertical NMOS transistor integrated with an N-type IGBT fabricated using the process of FIGS. 9(a) to 9(k) according to one embodiment of the present invention.
Figures 11A, 11B:
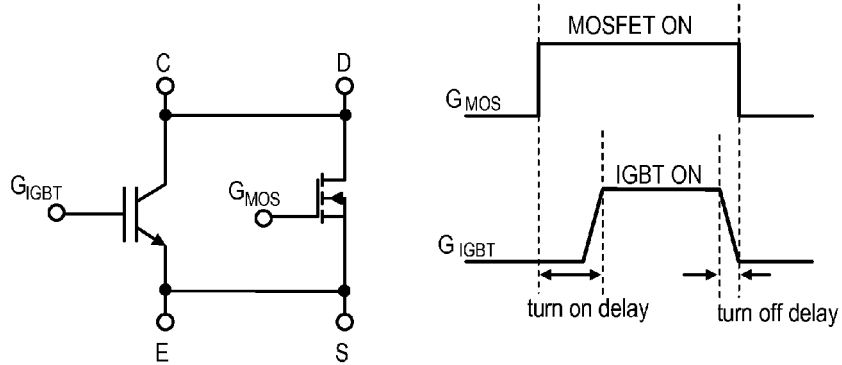
FIG. 11(a) illustrates the equivalent circuit diagram of the integrated MOSFET and IGBT device of FIG. 10.
FIG. 11(b) is the operational timing diagram of the MOSFET and IGBT devices of FIG. 11(a).

The fabrication processes described in FIGS. 9(a) to 9(l1) are useful in forming an array of MOS transistors integrated with IGBT devices, Schottky diodes and/or P-N junction diodes. FIG. 10 is a cross-sectional view of a vertical NMOS transistor integrated with an N-type IGBT fabricated using the process of FIGS. 9(a) to 9(k) according to one embodiment of the present invention. FIG. 11(a) illustrates the equivalent circuit diagram of the integrated MOSFET and IGBT device of FIG. 10 and FIG. 11(b) is the operational timing diagram of the MOSFET and IGBT devices of FIG. 11(a). Referring to FIG. 10, in a semiconductor device 800, vertical NMOS transistor 801b and IGBT device 801a are formed using the same fabrication process described above except that P+ layer 663 is selectively applied to certain transistor cells only to form the internal emitter of the IGBT. Otherwise, vertical NMOS transistor 801b and IGBT device 801a have identical structures. As thus constructed, the N-type IGBT 801a is connected in parallel with the NMOS transistor 801b, as shown in FIG. 11(a). The collector and drain terminals of the devices are connected through the bottom metallization while the emitter and source terminals of the devices are connected through the top metallization. In operation, the IGBT device 801a turns on after and turns off shortly before the NMOS transistor 801b. IGBT device 801a reduces conduction losses, and NMOS transistor 801b enhances the switching performance of the composite semiconductor device 800. The composite semiconductor device 800 enables a new power device structure to be formed, combining the best characteristics of NMOS (switching speed) and the best characteristics of IGBT (low "on" state voltage drop).

Figure 12:
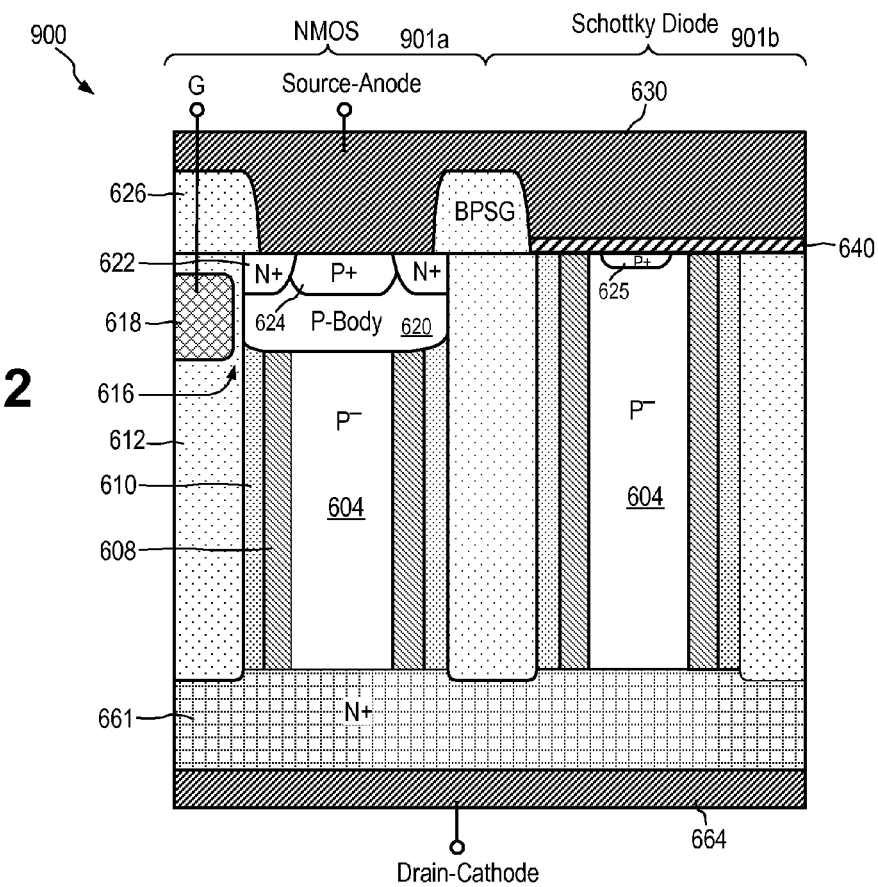
FIG. 12 is a cross-sectional view of a vertical NMOS transistor integrated with a Schottky diode fabricated using the process of FIGS. 9(a) to 9(e) and 9(f1) to 9(h1) and 9(j1) to 9(l1) according to one embodiment of the present invention.
Figure 13:
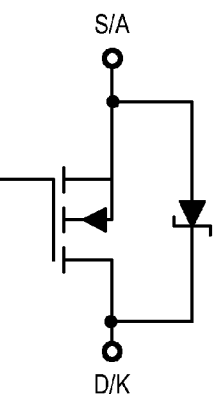
FIG. 13 illustrates the equivalent circuit diagram of the integrated MOSFET and Schottky diode of FIG. 12.

FIG. 12 is a cross-sectional view of a vertical NMOS transistor integrated with a Schottky diode fabricated using the process of FIGS. 9(a) to 9(e) and 9(f1) to 9(h1) and 9(j1) to 9(l1) according to one embodiment of the present invention. FIG. 13 illustrates the equivalent circuit diagram of the integrated MOSFET and Schottky diode of FIG. 12. Referring to FIG. 12, in a semiconductor device 900, NMOS transistor 901a and Schottky diode 901b are formed using the same basic nanotube N-Epi/P-Epi fabrication process. When the transistor structure is formed on the top of the P⁻ mesa 604, only a P+ region 625 is formed for the Schottky diode 901b. To streamline the process, the P+ region 625 could be made in the same step as P+ body contact region 624 in some embodiments of the present invention. In that case, P+ region 625 would have the same depth and concentration as P+ body contact region 624, though not illustrated that way in FIG. 12. Then, backside processing is carried out to form the N+ layer 661, such as by epitaxial growth. N+ layer 661 serves as the drain terminal of NMOS transistor 901a and the cathode terminal of Schottky diode 901b. Backside metallization 664 forms the contact electrode for the drain and cathode of both devices. When the topside processing is carried out, a Schottky metal layer 640 is first formed in the cell regions where a Schottky diode is to be formed. Then, the top side metallization 630 is applied to short the source and body of NMOS transistor 901a to the anode of Schottky diode 901b. As thus formed, topside metallization 630 forms the contact electrode for the source, body and anode of both devices. As thus constructed, NMOS transistor 910a is connected in parallel to Schottky diode 901b, as shown in FIG. 13.

Figure 14:
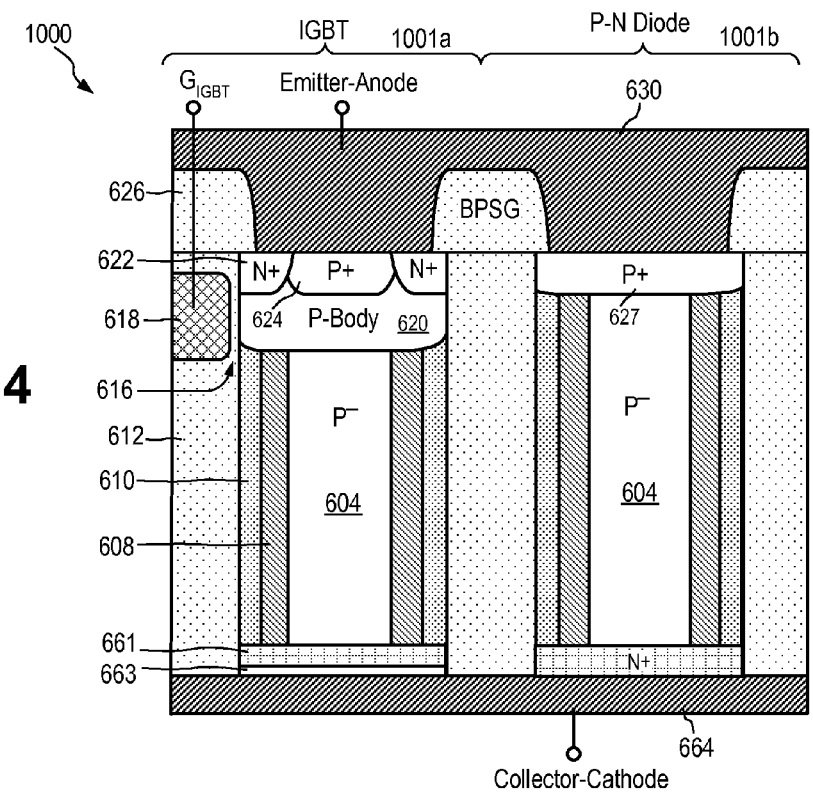
FIG. 14 is a cross-sectional view of an IGBT device integrated with a P-N diode fabricated using the process of FIGS. 9(a) to 9(k) according to one embodiment of the present invention.
Figure 15:
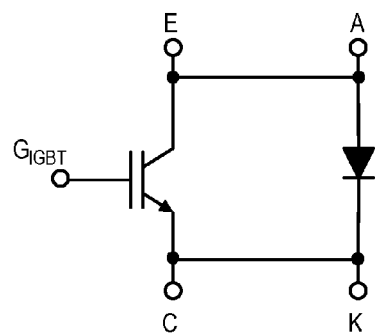
FIG. 15 illustrates the equivalent circuit diagram of the integrated IGBT and P-N junction diode of FIG. 14.

FIG. 14 is a cross-sectional view of an IGBT device integrated with a P-N diode fabricated using the process of FIGS. 9(a) to 9(k) according to one embodiment of the present invention. FIG. 15 illustrates the equivalent circuit diagram of the integrated IGBT and P-N junction diode of FIG. 14. Referring to FIG. 14, IGBT 1001a and P-N junction diode 1001b are formed using the same basic nanotube N-Epi/P-Epi fabrication process. When the transistor structure is formed on the top of the P⁻ mesa 604, only a P+ anode contact region 627 is formed for the P-N junction diode 1001b. Then, topside processing is carried out to form topside metallization 630 for connecting the emitter and anode terminals of IGBT 1001a and P-N junction diode 1001b. Then, backside processing is carried out to form the N+ layer 661 by ion implantation. N+ layer 661 serves as the N-buffer/field stop layer of the IGBT device 1001a and the cathode terminal of P-N junction diode 1001b. A P+ layer 663 is selectively formed in the IGBT cells to form the internal emitter of the IGBT device. Backside metallization 664 forms the contact electrode for the collector and cathode of both devices. As thus constructed, IGBT device 1001a is connected in parallel to P-N junction diode 1001b, as shown in FIG. 15.

Figure 16A:
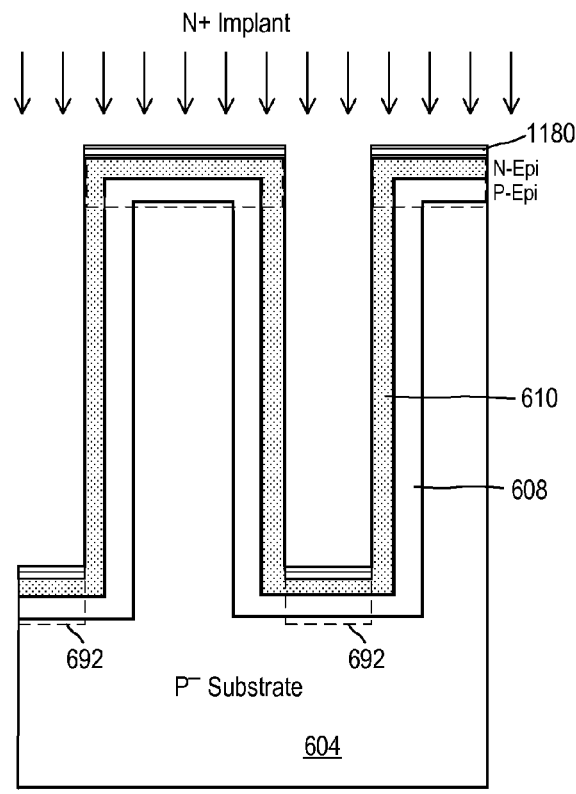
FIGS. 16(a) and 16(b) are cross-sectional view of alternate processing steps which can be used to form the vertical trench MOSFET device according to one embodiment of the present invention.
Figure 16B:
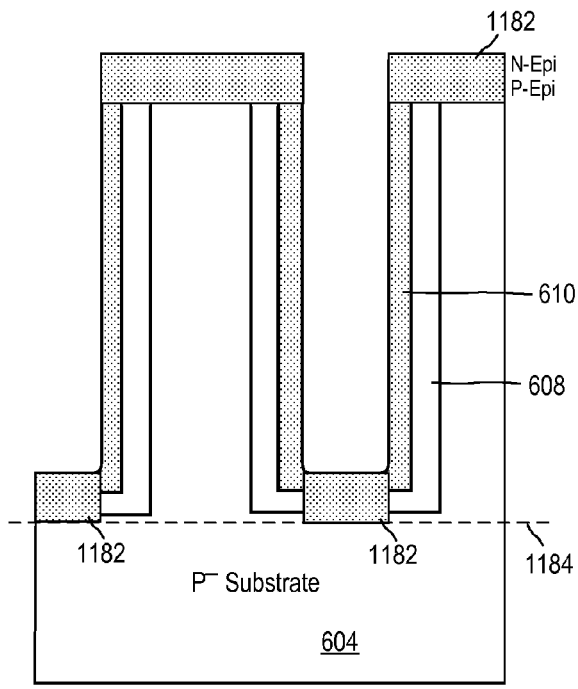

FIGS. 16(a) and 16(b) are cross-sectional views of alternate processing steps which can be used to form the vertical trench MOSFET device according to one embodiment of the present invention. Referring to FIG. 16(a), after the P-Epi layer 608 and the N-Epi layer 610 are epitaxially grown, an anisotropic N+ implantation is carried out to counter-dope the N-Epi and P-Epi layers at the bottom of the trenches. The penetration depth of the N+ implantation is denoted by dotted circle 692. In the present embodiment, a thin screen oxide layer 1180 is used to protect the horizontal surface of the semiconductor structure from implantation damages. The anisotropic N+ implantation also counter-dopes the N-Epi and P-Epi at the top of the P⁻ mesa 604. After annealing, the structure in FIG. 16(b) results where N+ regions 1182 are present at the top of the P⁻ mesa 604 and the bottom of the trenches. A chemical mechanical polishing (CMP) step can be carried out to remove the N+ regions 1182 from the top of the P⁻ mesa 604 before the transistor structure is formed. Then, the P⁻ substrate is backside ground all the way to the bottom of the N+ layer 1182 at the bottom of the trenches, indicated by dotted line 1184. Epitaxial growth can be carried out to form the N+ drain or N+ field stop regions for the intended devices. Furthermore, epitaxial growth can be carried out to form the P+ layer to form the internal emitter of IGBT devices. When the processing steps in FIGS. 16(a) and 16(b) are used, backside ion implantation can be avoided entirely and only epitaxial growth is used for growing the backside layers. This method of counter-doping the bottom of the trenches can also be performed for the processes that begin with P-Mesa-Epi grown over a highly doped N+ substrate. In that case, the trenches would not need to extend all the way to substrate, as long as the anisotropic N+ implantation through the trench bottoms and out-diffusing from the substrate are enough to connect the N-Epi nanotube to the N+ substrate.

As discussed above, a semiconductor device, including a MOSFET device, a IGBT device, a Schottky diode and a P-N junction diode, can be constructed using the N-Epi/P-Epi nanotube transistor structure of the present invention by forming an array of transistor cells. The transistor cells can be of the single nanotube structure or the double nanotube structure depending on the application. The array of transistor cells can be a 1-dimensional array or a 2-dimensional array. According to alternate embodiments of the present invention, the transistor cells are formed in a 2-dimensional array using hexagonal transistor cells or rectangular transistor cells.

Figure 17:
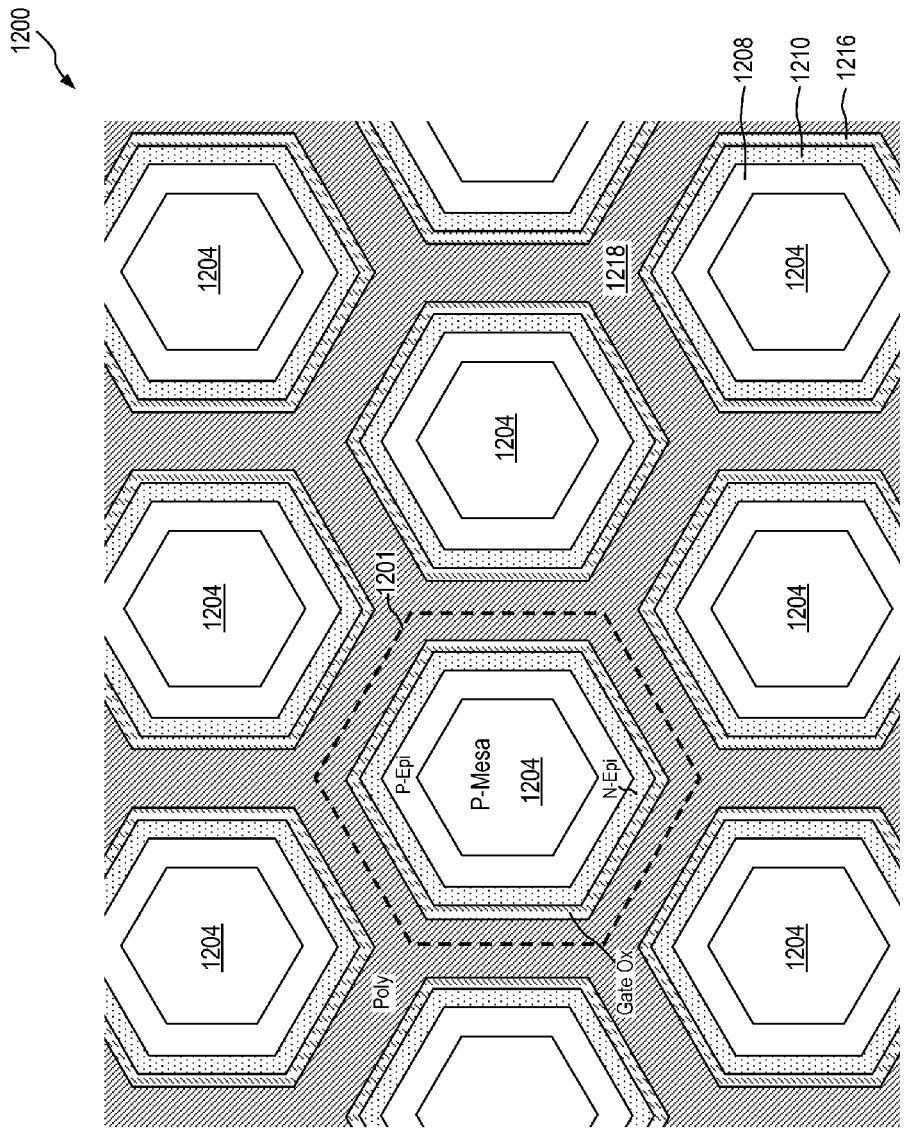
FIG. 17 is a top view of an array of hexagonal transistor cells according to one embodiment of the present invention.

FIG. 17 is a top view of an array of hexagonal transistor cells according to one embodiment of the present invention.

Referring to FIG. 17, a transistor array 1200 is formed using a two-dimensional array of transistor cells 1201. Transistor cell 1201 is a hexagonal unit cell including a P-type Mesa 1204, surrounded by P-Epi layer 1208, further surrounded by N-Epi layer 1210. Outside of the N-Epi layer 1210 is the gate oxide layer 1216. The trenches of the transistor array 1200 are filled with the polysilicon gate electrode 1218. The hexagonal unit cell structure provides a symmetrical cell structure.

Figure 18:
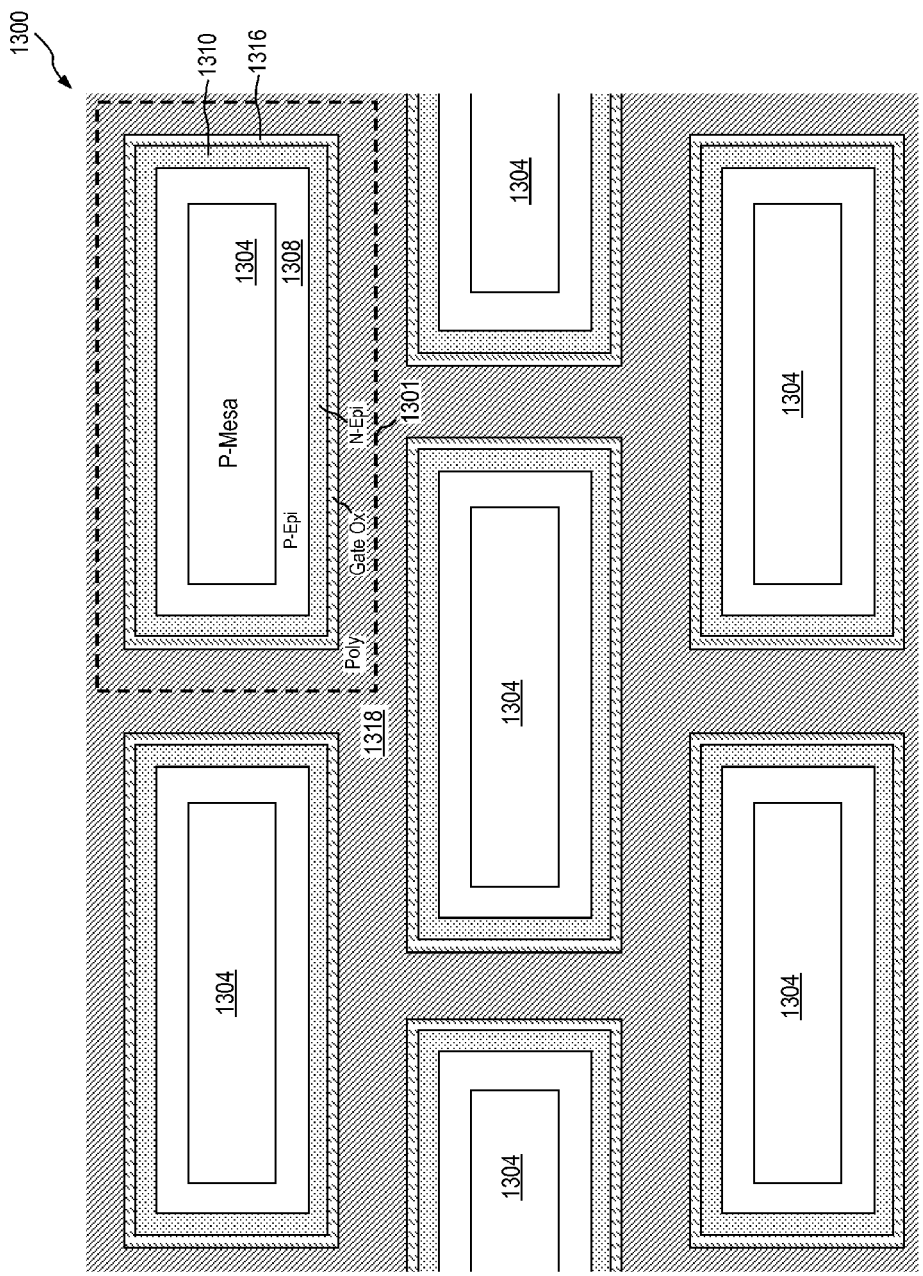
FIG. 18 is a top view of an array of rectangular transistor cells according to one embodiment of the present invention.

FIG. 18 is a top view of an array of rectangular transistor cells according to one embodiment of the present invention. Referring to FIG. 18, a transistor array 1300 is formed using a two-dimensional array of transistor cells 1301. Transistor cell 1301 is a hexagonal unit cell including a P-type Mesa 134, surrounded by P-Epi layer 1308, further surrounded by N-Epi layer 1310. Outside of the N-Epi layer 1310 is the gate oxide layer 1316. The trenches of the transistor array 1300 are filled with the polysilicon gate electrode 1318.

Termination Structure

A power semiconductor device formed on an integrated circuit, such as a power MOSFET device constructed using the single or double nanotube structure described above, typically includes an active region and a termination region. The active region is the area in which the charge balance devices are constructed. The termination region is the area where no active devices are located and is used to provide isolation between the active devices and the physical perimeter of the integrated circuit or the die and to spread the electric field along the periphery of the device. The termination region is provided to ensure that the power semiconductor device achieve charge balance and maintains the proper breakdown voltage and avoids excess device leakage at the die periphery. Proper design of the termination region is important so that the interface region between the active region and the termination region does not become the limiting factor in achieving high breakdown voltage.

More specifically, one function of the termination region is to divide the highest operating voltage of the integrated circuit into smaller voltage steps, each step being less than the silicon breakdown voltage, and to spread out the voltage steps over the termination region. In operation, the termination region for N-channel devices steps up the voltage incrementally until the highest operating voltage is reached before the edge of the die. For P-channel devices, the termination region steps down the operating voltage incrementally until the lowest voltage potential is reached at the edge of the die. Another function of the termination region is to keep the depletion region from reaching the edge of the die. If the depletion region is to reach the edge of the die, abrupt electric field termination results, leading to reduced breakdown voltage for the semiconductor device or to a device that can achieve operating voltage but with much higher leakage current.

Figure 19:
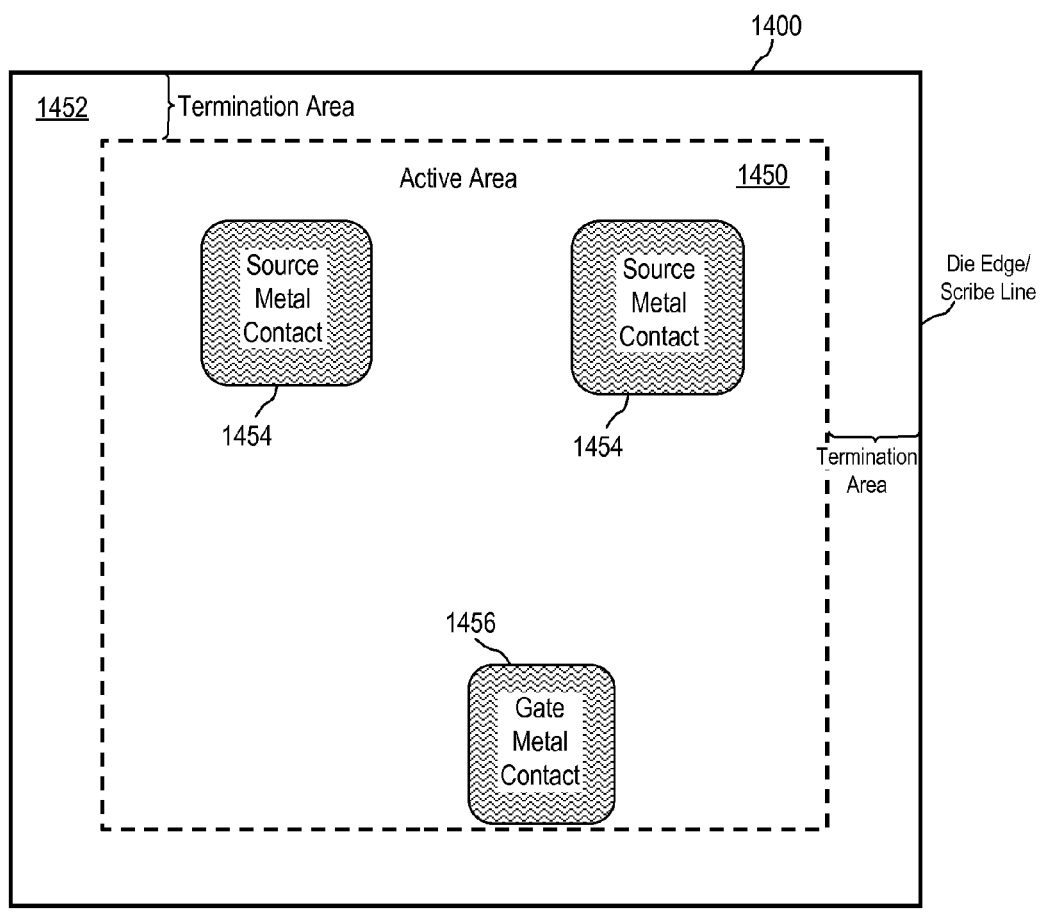
FIG. 19 is a top view of an integrated circuit (die) for a power semiconductor device including an active area and a termination area according to one embodiment of the present invention.

FIG. 19 is a top view of an integrated circuit (die) for a power semiconductor device including an active area and a termination area according to one embodiment of the present invention. Referring to FIG. 19, the integrated circuit 1400 includes an active area 1450 and a termination area 1452. The active devices, such as MOSFETs, IGBTs, Schottky diodes and P-N junction diodes, are constructed in the active area 1450. The termination area 1452 encircles the active area along the physical perimeter of the die. As thus constructed, termination area 1452 isolates the active area 1450 from the physical perimeter of the die. As a completed integrated circuit, die 1400 is covered by a passivation layer and openings in the passivation layer are provided for making electrical connection to the source electrode and the gate electrode. The drain electrode (not shown) is on the die bottom. FIG. 19 illustrates one exemplary embodiment of the source metal connection and the gate metal connection. As shown in FIG. 19, openings in the passivation layer are made to expose metal pads for the source metal contact 1454 and for the gate metal contact 1456, the source metal and the gate metal contacts residing in the active area 1450 of integrated circuit 1400.

According to one aspect of the present invention, a termination structure using a floating ring or nanotube scheme is provided for a power semiconductor device constructed using the aforementioned single or double nanotube structure. The termination structure surrounds the physical perimeter of the integrated circuit and encircles the active area of the power semiconductor device. The termination structure distributes the electric field across the termination region, which increases the breakdown voltage. In the present embodiment, the termination structure is formed using the same single or double nanotube structure described above.

In general, the floating ring scheme for an N-type device uses a series of alternating P-type and N-type regions where the first P-type region is grounded, the intermediate P-type regions are left floating, and the N-type regions are connected to the highest operating voltage of the integrated circuit. In operation, each N-type region pinches off at a punch-through voltage $V_{PT}$ and the floating P-type regions are driven to the punch-through voltage of the previous N-type regions such that the series of adjacent P-type and N-type regions operates to increase the voltage in the termination region from the ground voltage to the highest operating voltage in incremental steps smaller than the silicon breakdown voltage. For P-type devices, the floating ring scheme applies with the first N-type region being coupled to the highest operating voltage and the voltage being stepped down in the termination region. The construction and operation of the termination structure of the present invention will now be described in details with reference to FIGS. 20-29.

Figure 20:
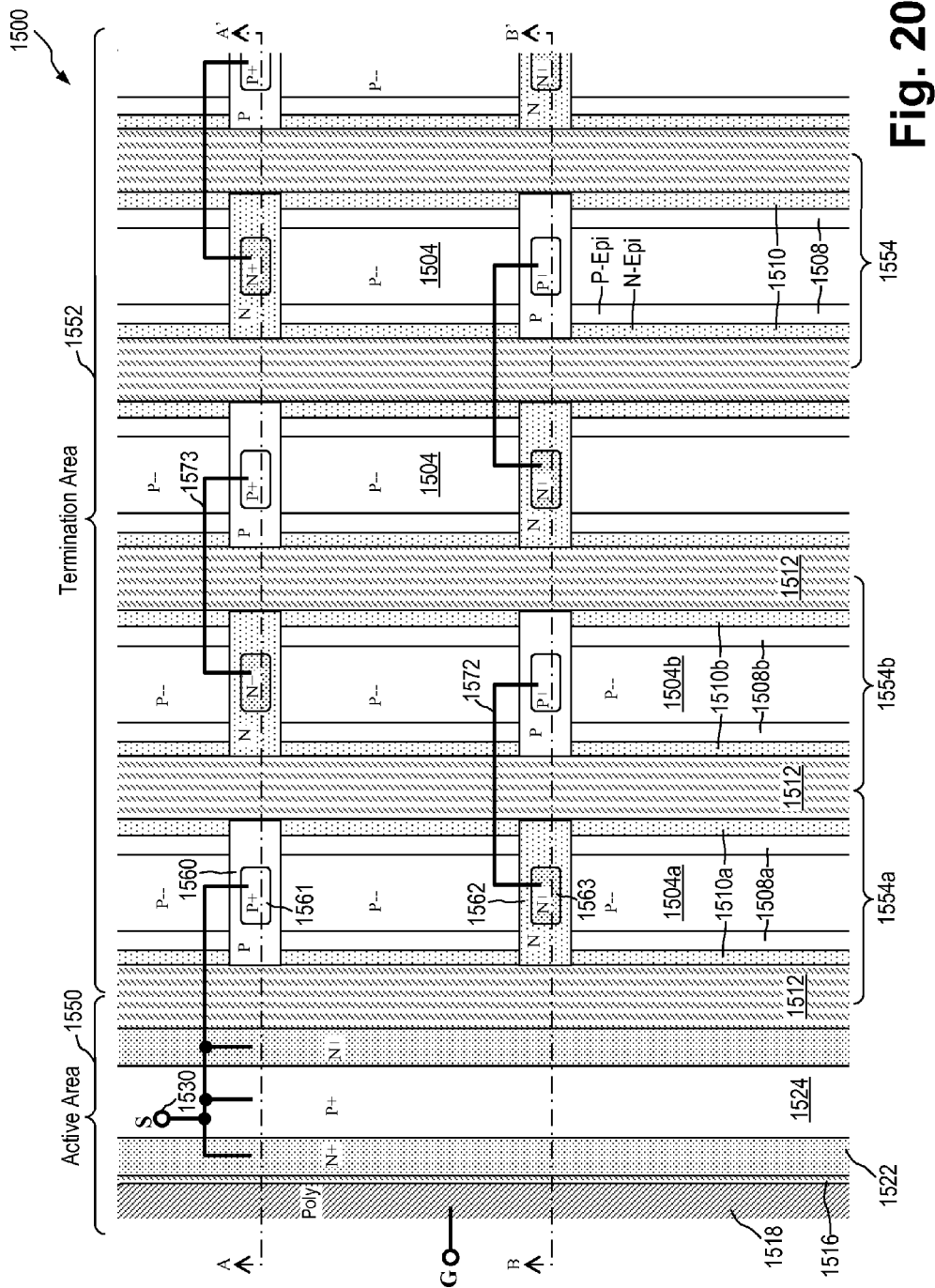
FIG. 20 is a top view of a termination structure incorporated in an integrated circuit including active devices constructed using the double nanotube process according to one embodiment of the present invention.

FIG. 20 is a top view of a termination structure incorporated in an integrated circuit including active devices constructed using the double nanotube process according to one embodiment of the present invention. Referring to FIG. 20, an integrated circuit 1500 for a power semiconductor device includes an active area 1550 for housing active devices. In the present illustration, the active devices are N-type devices, such as vertical NMOS transistors or N-type IGBTs. In FIG. 20, the last NMOS transistor cell in active area 1550 is shown and includes the gate electrode 1518, the gate oxide 1516, the N+ source region 1522 and the P+ body contact region 1524. The N+ source region 1522 and P+ body contact region 1524 are electrically connected together and to a source electrode 1530, symbolically illustrated as connecting lines and a terminal "S" in FIG. 20. For the n-channel devices on integrated circuit 1500, the source electrode 1530 is connected to the source (or emitter for IGBT) potential which is the lowest potential of the integrated circuit, usually ground. The N+ substrate of the NMOS transistor (not shown) is the drain electrode (or collector) of the NMOS transistor and is connected to the highest operating voltage (HV) of the integrated circuit 1500. In the case of the p-channel devices being formed in the integrated circuit, the source/emitter electrode is connected to the highest operating voltage of the integrated circuit while the drain/collector electrode is connected to the lowest potential of the integrated circuit (usually ground). The present description is directed to a termination structure for N-channel devices but the operating principles apply to an integrated circuit formed with P-channel devices with appropriate reversal of voltage polarities.

Integrated circuit 1500 includes a termination structure formed in a termination area 1552 of the integrated circuit. A portion of the terminal structure adjoining the active area 1550 is shown in FIG. 20. It is understood that the terminal structure extends from the end of the active area to the edge of the die on which the integrated circuit 1500 is formed and only a portion of the termination structure is shown in FIG. 20. The termination structure may include an end termination cell at the die edge, as will be described in more detail below. In the present embodiment, the termination structure includes termination cells 1554 formed using the same N-Epi/P-Epi double nanotube structure as used by the active devices. That is, each termination cell is formed by a P-Mesa layer 1504 having sidewalls covered by the P-Epi nanotube 1508 and then the N-Epi nanotube 1510. The P-Mesa layer 1504 can be a P-Mesa-Epi layer or a P-Mesa-Substrate, as described above. The termination structure do not use the polysilicon gate electrode and thus the termination cells 1554 are separated by the oxide-filled trenches 1512 without any polysilicon gate electrode formed therein.

Termination cells 1554 are interconnected to form the series of alternating P-type and N-type regions for stepping up the operating voltage of the integrated circuit. More specifically, the N-Epi nanotubes are used as the N-type regions and the P-Epi nanotubes with the P-Mesa layer are used as the P-type regions. The nanotubes and P-Mesa layer are interconnected through P and N type doped regions so that they form a series of alternating P-type and N-type regions. In the serial connection of alternate P and N type regions, the first P-type region (P-Epi nanotube/P-Mesa layer) is connected to the source/emitter potential and the last N-type regions (N-Epi nanotubes) is connected to the drain/collector potential. For N-channel devices, the first P-type region is connected to ground while the last N-type region is connected to the highest operating voltage (HV) of the integrated circuit 1500 through the N+ substrate (not shown in FIG. 20). All the other P-type regions (P-Epi nanotubes/P-Mesa layer) are left floating. The other N-type regions in the termination region are connected to the substrate, but are blocked by the charge balance and the potential difference. For P-channel devices, the first N-type region is connected to the highest operating voltage of the integrated circuit while the last P-type region is connected to ground.

Accordingly, in the present embodiment, in each termination cell 1554, the P-Epi nanotubes 1508 and the P-Mesa layer 1504 are electrically connected to a lightly doped P-type doped region 1560 ("P-doped region") and the N-Epi nanotubes 1510 are electrically connected to a lightly doped N-type doped region 1562 ("N-doped region"). The N-doped regions 1562 and the P-doped regions 1560 of successive termination cells are interconnected using metal interconnects to form the series of alternating P-type and N-type regions. In the present embodiment, each P-doped region 1560 includes a heavily doped P+ region 1561 and each N-type doped region 1562 includes a heavily doped N+ region 1563. Heavily doped P+ region 1561 and N+ region 1563 are provided to facilitate ohmic contact from the P and N doped regions 1560, 1562 to the metal interconnects. Separate heavily doped P+/N+ regions 1561 and 1563 are optional and may be omitted in other embodiments of the present invention.

In the termination structure of the present invention, the series of alternating P-type and N-type regions is formed as follows. The first termination cell 1554a is formed by P-Epi nanotube 1508a and P-Mesa layer 1504a which is electrically connected through P-doped region 1560 and P+ region 1561 to the source electrode 1530. Thus, the first P-type region (P-Epi nanotube 1508a/P-Mesa layer 1504a) is grounded. N-Epi nanotube 1510a is immediately adjacent to P-Epi nanotube 1508a and the nanotubes (with the underlying P-Mesa layer) together form a first pair or adjacent P and N regions. The N-Epi nanotube 1510a is connected through N-doped region 1562 and N+ region 1563 using a metal interconnect 1572 to the "next" P-Epi nanotube 1508b/P-Mesa layer 1504b in the next termination cell 1554b, which with the N-Epi nanotube 1510b form the next pair of adjacent P and N regions. The interconnection continues with the P-Epi nanotube/P-Mesa layer and the N-Epi nanotube in the same termination cell forming a pair of adjacent P-type and N-type regions, and the N-Epi nanotube and the P-Epi nanotube/P-Mesa layer in adjacent termination cells, separated by oxide-filled trenches, are interconnected to continue the serial connection of P-type and N-type regions to form the termination structure.

Figure 21:
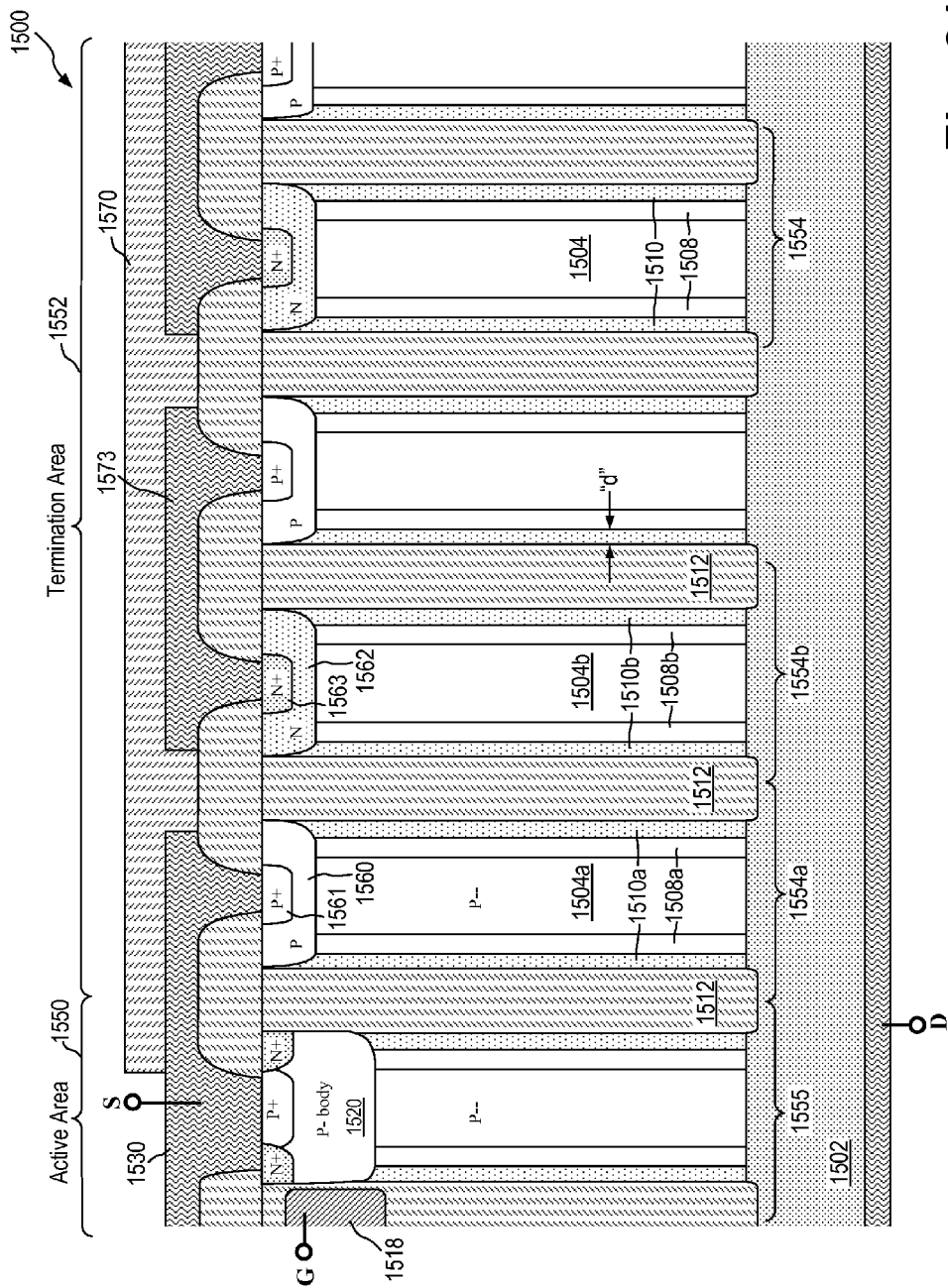
FIG. 21 is a cross-sectional view of the termination structure of FIG. 20 along a line A-A' according to one embodiment of the present invention.
Figure 22:
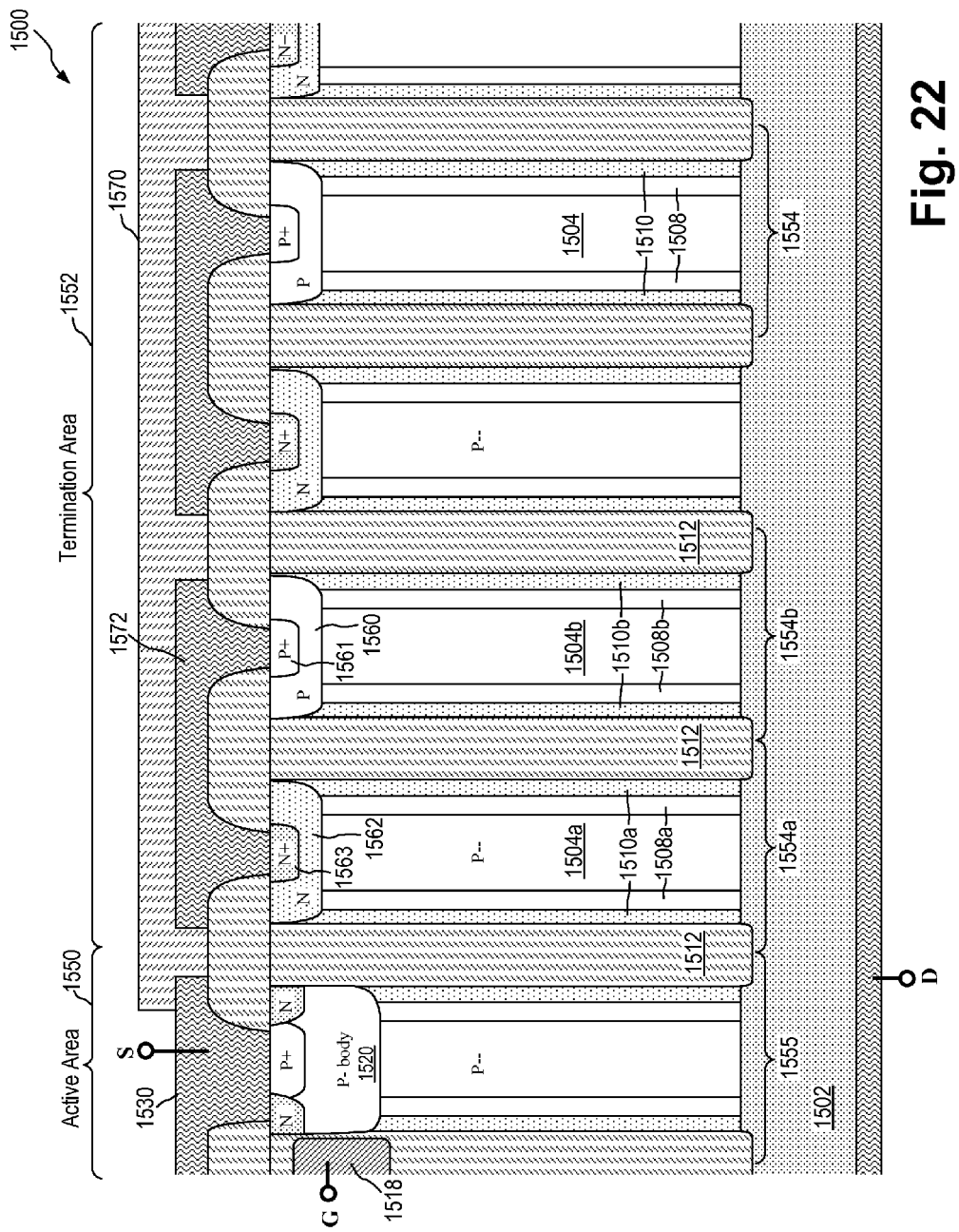
FIG. 22 is a cross-sectional view of the termination structure of FIG. 20 along a line B-B' according to one embodiment of the present invention.

In the embodiment shown in FIG. 20, the P-doped regions 1560 and the N-doped regions 1562 are arranged alternately in two rows to facilitate the interconnection of neighboring termination cells. The serial connection of the P-Epi nanotube/P-Mesa regions and the N-Epi nanotube regions is further illustrated by the cross-sectional views of integrated circuit 1500 along line A-A' and along line B-B', as shown in FIGS. 21 and 22, respectively. Referring first to FIG. 21 which illustrates the cross-sectional view of integrated circuit 1500 along line A-A', vertical NMOS transistor 1555 is the last active device in the active area 1550 and the termination area 1552 starts with the first termination cell 1554a including P-Epi nanotube 1508a and P-Mesa layer 1504a connected to P-doped region 1560 and P+ region 1561 which are in turn electrically connected to the source electrode 1530. Thus P-Epi nanotube 1508a and P-Mesa layer in the first termination cell 1554a are therefore connected to the source potential. The N-Epi nanotube 1510 in each of the termination cells 1554 is connected to the N+ substrate 1502 which is the drain terminal of the vertical NMOS transistor 1555 but is vertically blocked from the drain potential by the horizontal charge balance (and potential difference) between the P-Mesa 1504/P-Epi nanotube 1508 and N-Epi nanotube 1510. N+ substrate 1502 is connected to the highest operating voltage (HV) of the integrated circuit 1500. N-Epi nanotubes 1510 in all of the termination cells are therefore connected to the highest operating voltage of the integrated circuit. In other embodiments, N+ substrate 1502 can be an N+ layer formed on the bottom surface of the P-Mesa layer, as shown in FIGS. 9(a) to 9(l1).

The connection of N-Epi nanotube 1510a in the first termination cell 1554a to the P-Epi nanotube 1508b in the next termination cell 1554b is accomplished at a separate location along the termination cell away from P-doped region 1560. More specifically, the N-doped region 1562 for connecting the N-Epi nanotube 1510a to the P-doped region 1560 in termination cell 1554b is disposed along the line B-B' and shown in the cross-sectional view in FIG. 22. Referring to FIG. 22, N-doped region 1562 of the first termination cell 1554a is electrically connected through a metal interconnect 1572 to P-doped region 1560 of the next termination cell 1554b. The N-Epi nanotube 1510 in the first termination cell 1554a is thus connected to the P-Epi nanotube 1508b/P-Mesa layer 1504b in the next termination cell 1554b.

Then, the N-doped region 1562 of the termination cell 1554b is connected through a metal interconnect 1573 to the P-doped region 1560 of the next termination cell 1554c (FIG. 21). The serial connection continues as shown in FIGS. 21 and 22 to form a long string of termination cells with N-Epi nanotube and P-Epi nanotube/P-Mesa layer connected in series between the first P-Epi nanotube/P-Mesa layer at the source/emitter potential and the last N-Epi nanotube at the drain/collector potential which is the highest operating voltage for the N-channel devices in the integrated circuit.

The termination structure as constructed in FIGS. 20-22 is able to sustain the high voltage level of the active devices by incrementally increasing the voltage at each termination cell. More specifically, in each termination cell, the P-Epi nanotube/P-Mesa layer and the N-Epi nanotube are pinched off to a punch-through voltage $V_{PT}$. Because the P-Epi nanotube and P-Mesa layer are left floating, the voltage at each termination cell increases in increments of the punch-through voltage $V_{PT}$ until the highest operating voltage is reached at the end of the termination cells near the edge of the die. Another way to look at the termination cells is as a series of PN diodes. The P-Mesa 1504 and P-Epi 1508 of each termination cell form a PN diode with the N-Epi 1510 of the same cell. This PN diode is reverse biased in blocking mode such that it holds a certain voltage. The N portion (1510) of the diode is shorted to the P portion (1504, 1508) of the next cell by an electrical short (e.g., 1572).

Figure 23:
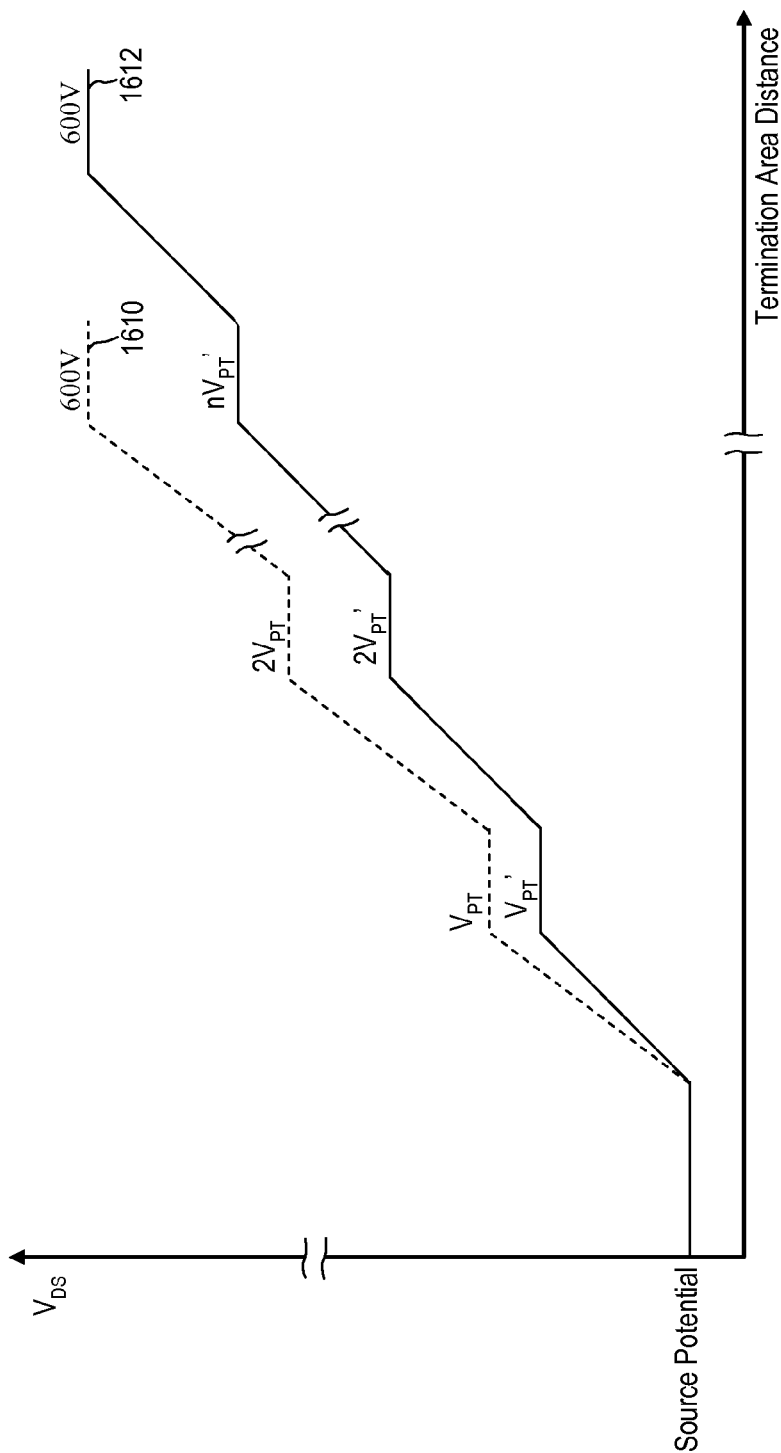
FIG. 23 is a graph illustrating the voltage vs. termination cells characteristic of the terminal structure according to one embodiment of the present invention.

FIG. 23 is a graph illustrating the voltage characteristic of the terminal structure according to one embodiment of the present invention. Referring first to curve 1610 in FIG. 23, the voltage of the termination structure starts at the source voltage as the first P-type region is connected to the source electrode. Then, the first N-type region is pinched off and a punch-through voltage ($V_{PT}$) is reached in the first N-type region. The next floating P-type region is driven and held at the punch-through voltage ($V_{PT}$). The next N-type region is pinched off and driven to another punch-through voltage ($V_{PT}$) so that the following P-type region is driven to and held at two times the punch-through voltage ($2V_{PT}$). The voltage step continues incrementally until the highest operating voltage (e.g. 600V) is reached at the last termination cell at the edge of the die. FIG. 23 illustrates the voltage characteristics of another termination structure which will be described in more detail below.

The punch-through voltage of the N-type region is a function of the thickness and the doping level of the N-type region. For the termination structure of the present invention, the punch-through voltage is a function of the thickness and the doping level of the N-Epi nanotubes. Because the N-Epi nanotubes 1510 have uniform and fixed thickness (denote "d" in FIG. 21), the punch-through voltage is only a function of the doping level of the N-Epi nanotubes. Typically punch-through voltage values are in the range of 10V to 40V.

Figure 24:
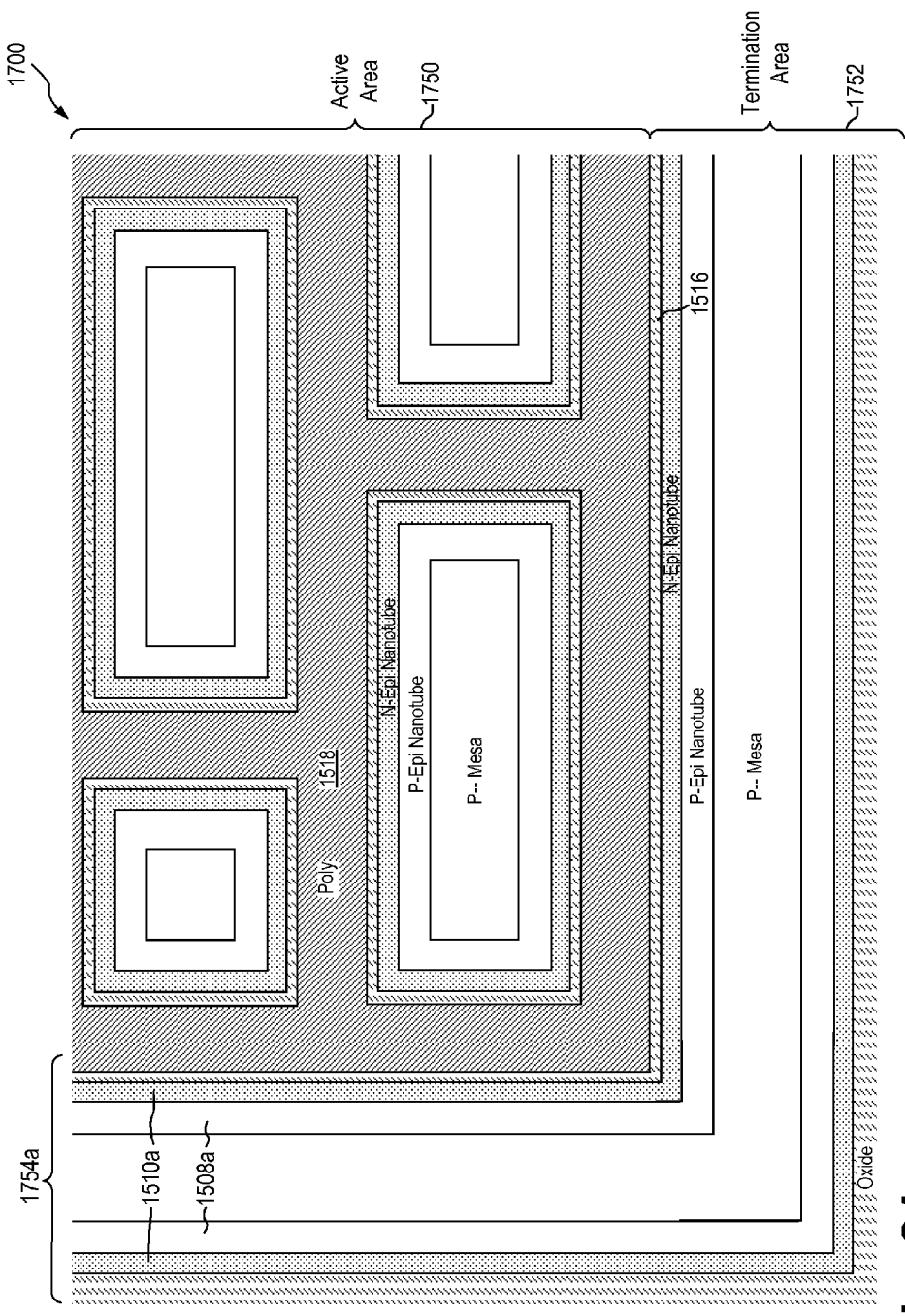
FIG. 24 is a top view of an integrated circuit illustrating the interface between the active area and a first termination ring of a termination structure according to an alternate embodiment of the present invention.

FIG. 24 is a top view of an integrated circuit illustrating the interface between the active area and a first termination ring of a termination structure according to an alternate embodiment of the present invention. Referring to FIG. 24, integrated circuit 1700 includes active devices formed in an active area 1750 using the double nanotube structure with the active devices being formed as rectangular cells. FIG. 24 illustrates a corner of integrated circuit 1700 where the termination area 1752 is formed as a ring to encircle the active area 1750. More specifically, the first termination cell is a termination ring 1754a encircling and interfacing the active area 1750. Additional concentric termination rings are provided sufficient to increase the voltage incrementally from the source potential at the first termination ring to the highest operating voltage of the integrated circuit at the last termination ring, as described above.

Figure 25:
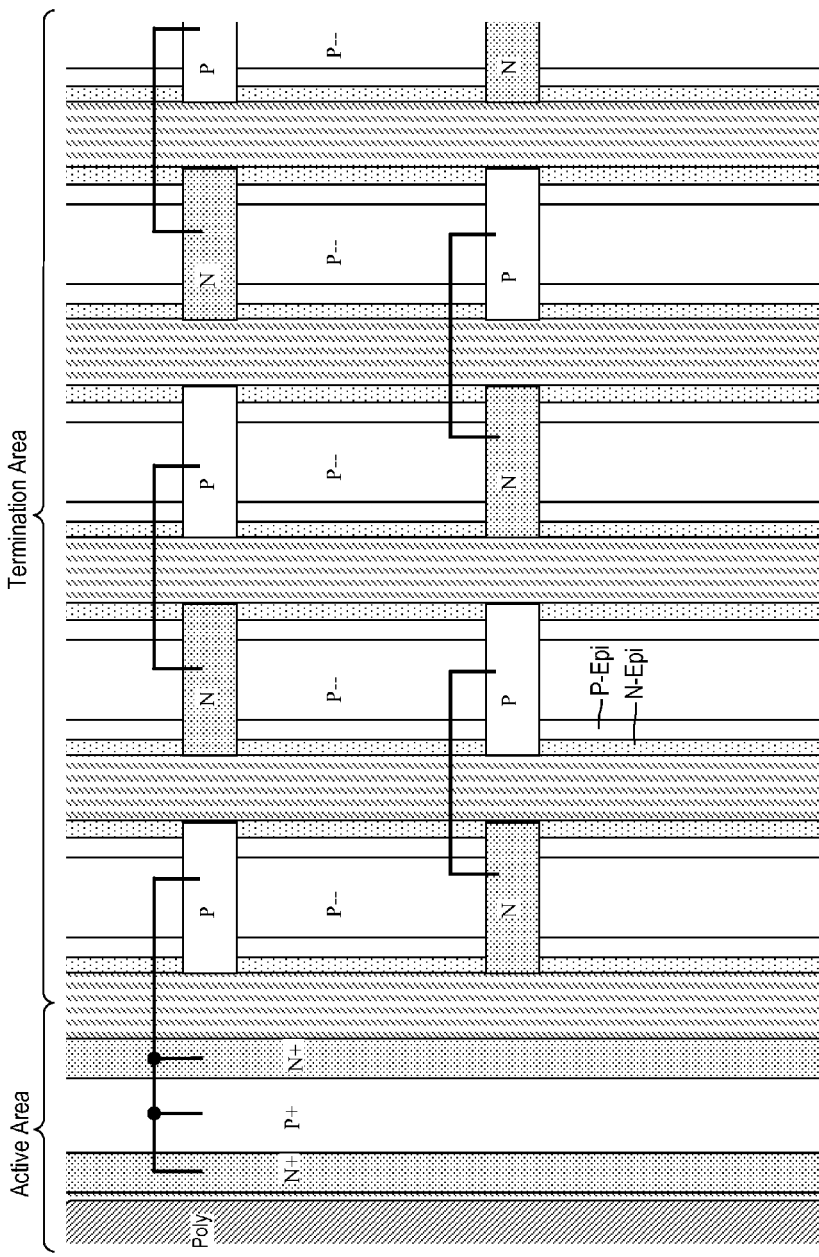
FIG. 25 is a top view of a termination structure incorporated in an integrated circuit including active devices constructed using the double nanotube process according to a first alternate embodiment of the present invention.

According to alternate embodiments of the present invention, the P-Epi nanotubes and P-Mesa layers are each connected to a P-doped region without a heavily doped P+ region residing therein, and the N-Epi nanotubes are each connected to an N-doped region without a heavily doped N+ region residing therein, as shown in FIG. 25. The termination structure in FIG. 25 is more simple to implement provided that proper ohmic contacts are made to the P-doped regions and N-doped regions for forming the interconnected series of termination cells.

Figure 26:
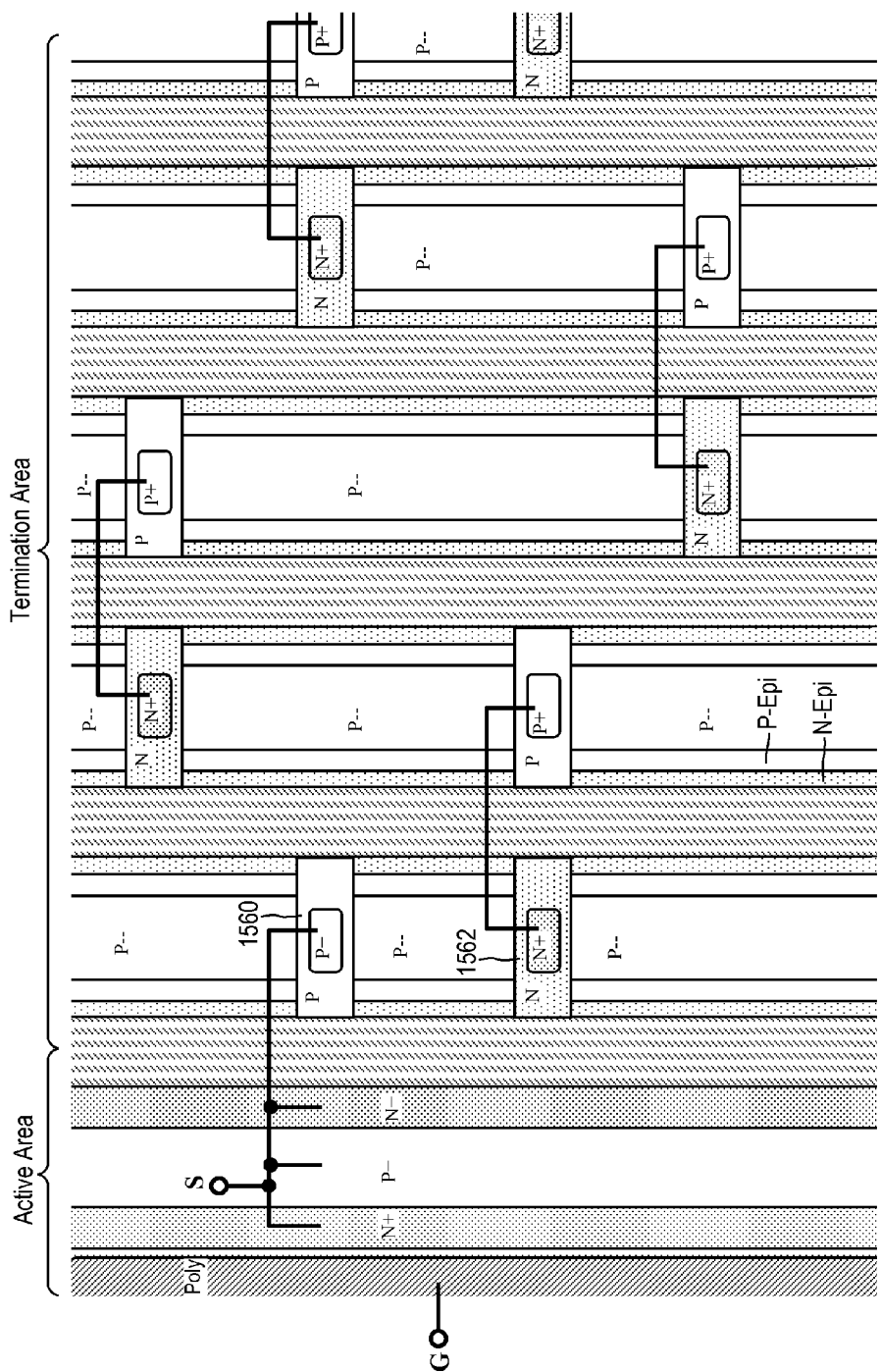
FIG. 26 is a top view of a termination structure incorporated in an integrated circuit including active devices constructed using the double nanotube process according to a second alternate embodiment of the present invention.

According to another alternate embodiment of the present invention, the termination structure is formed using staggered P and N doped regions, as shown in FIG. 26. That is, the N and P doped regions 1562, 1560 are not formed on the same line as in FIG. 20. Rather, each pair of interconnected N/P doped regions are staggered or offset for each other. Staggering the N/P doped regions allows for a more compact layout by avoiding the minimum spacing requirements between metal contacts and metal interconnections.

Figure 27:
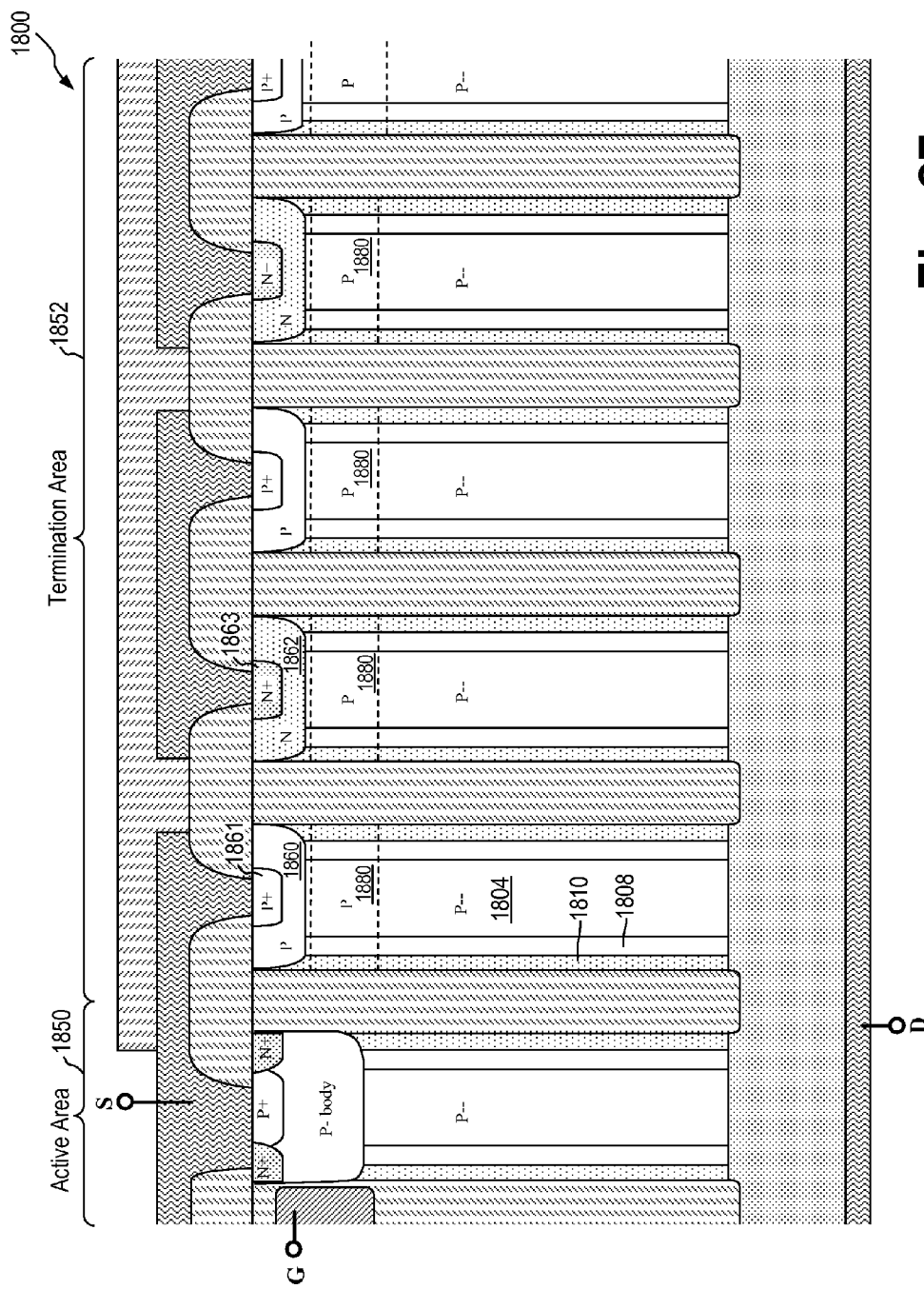
FIG. 27 is a cross-sectional view of a termination structure incorporated in an integrated circuit including active devices constructed using the double nanotube process according to a third alternate embodiment of the present invention.

According to alternate embodiments of the present invention, a sub-surface P-type implant region is formed in the termination cells to lower the N nanotube doping concentration. FIG. 27 is a cross-sectional view of a termination structure incorporated in an integrated circuit including active devices constructed using the double nanotube process according to a third alternate embodiment of the present invention. Referring to FIG. 27, integrated circuit 1800 includes a termination structure constructed in the same manner as described above with reference to FIGS. 20-22. However, the termination structure in integrated circuit 1800 includes P-type implant regions 1880 formed under the surface of P-Mesa layer 1804. In particular, P-type implant regions 1880 are formed deep under the surface region. In the present embodiment, P-type implant regions 1880 are positioned the P-doped regions 1860 and the N-doped regions 1862 in each termination cell. In one embodiment, P-type implant regions 1880 are formed using a high energy implantation using Boron as dopants.

The P-type implant regions 1880 formed in each termination cells have the effect of charge compensating the N-Epi nanotubes 1810 so as to adjust the punch-through voltage. More specifically, the effective N-type doping concentration in the N-Epi nanotubes within the P-type implant regions 1880 is reduced and the punch-through voltage $V_{PT}$, which is a function of the N-type doping concentration, is reduced accordingly. In other words, the P-type implant region will deplete faster and at a lower punch-through voltage than the rest of the termination cell. The P-type implant region 1808 will force the pinch-off of the N-type and P-type regions to occur deeper in the termination cell, away from the surface of P-Mesa layer 1804 where the surface charge is often not uniform. By bringing the pinch-off event to a sub-surface level, the breakdown of the N-type and P-type regions will be more uniform.

Referring back to FIG. 23, curve 1612 illustrates the voltage characteristics of the termination structure of FIG. 27 including the sub-surface P-type implant regions 1880. The P-type implant regions 1880 has the effect of lowering the N-type doping concentration of the N-Epi nanotubes, leading to a lowered punch-through voltage $V_{PT}'$ at each termination cell. With the lowered punch-through voltage $V_{PT}'$, the voltage in the termination region rise slower than the case when the punch-through voltage is not modified (curve 1610). Thus, it takes more voltage steps (more termination cells) to reach the highest operating voltage (e.g. 600V). However, each step is at a lower voltage and the pinch off event is advantageously pulled away from the die surface.

Figure 28:
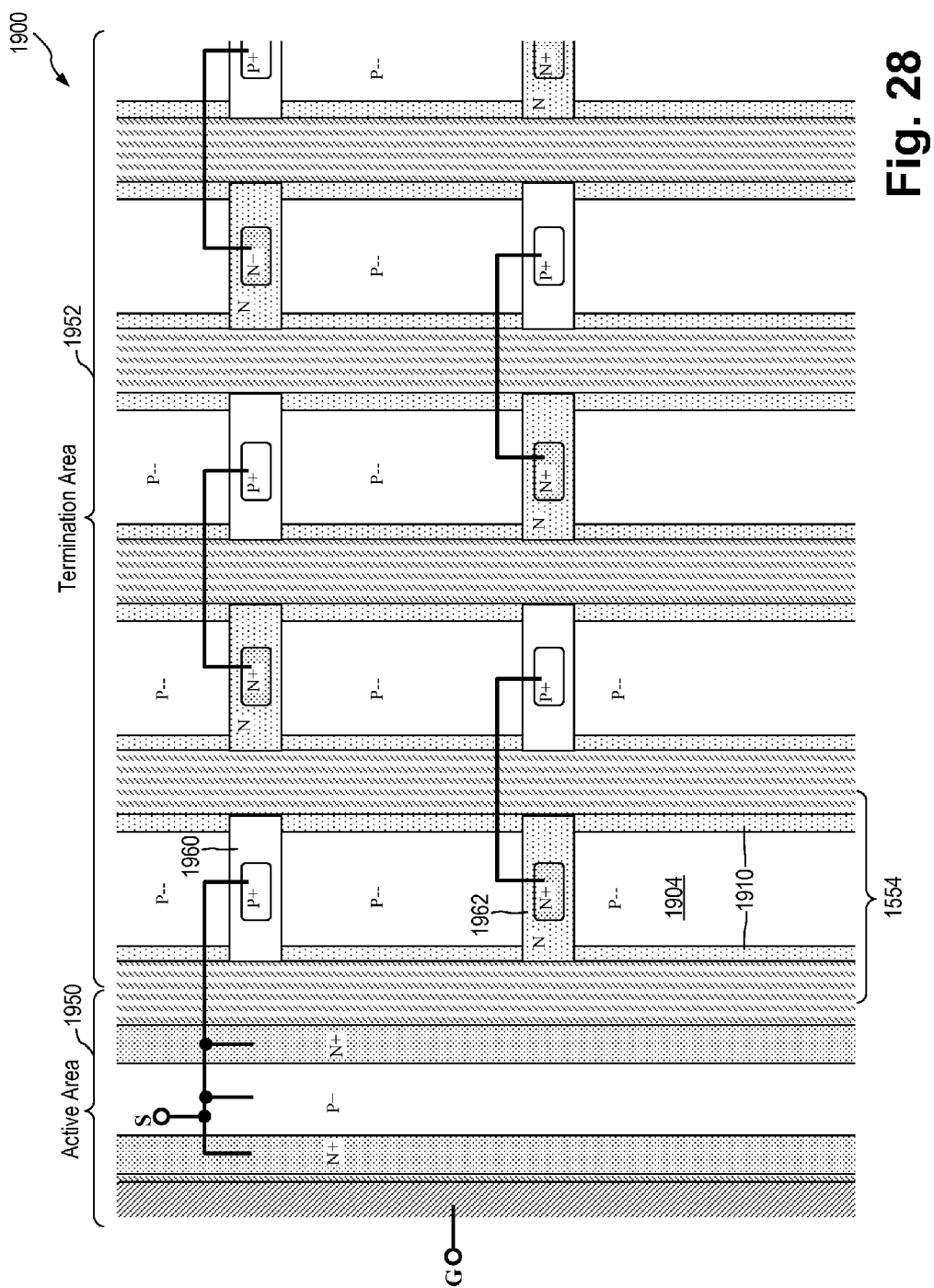
FIG. 28 is a cross-sectional view of a termination structure incorporated in an integrated circuit including active devices constructed using the single nanotube process according to a fourth alternate embodiment of the present invention.

In the above described embodiments, the termination structure is described as being formed using the double-nanotube structure. In other embodiments, the termination structure can be formed using the single-nanotube structure. FIG. 28 is a cross-sectional view of a termination structure incorporated in an integrated circuit including active devices constructed using the single nanotube process according to a fourth alternate embodiment of the present invention. Referring to FIG. 28, an integrated circuit 1900 includes a termination structure formed in a termination area 1952 including termination cells 1954 that are constructed in the same manner as described above in FIG. 20 except that termination cells 1954 are formed using only the N-Epi nanotubes 1910. The P-doped regions 1960 contacts the P-Mesa layer 1940 to form the P-type regions of the termination structure. The operation of the termination structure in integrated circuit 1900 is the same as the termination structure in integrated circuit 1500 of FIG. 20.

Figure 29:
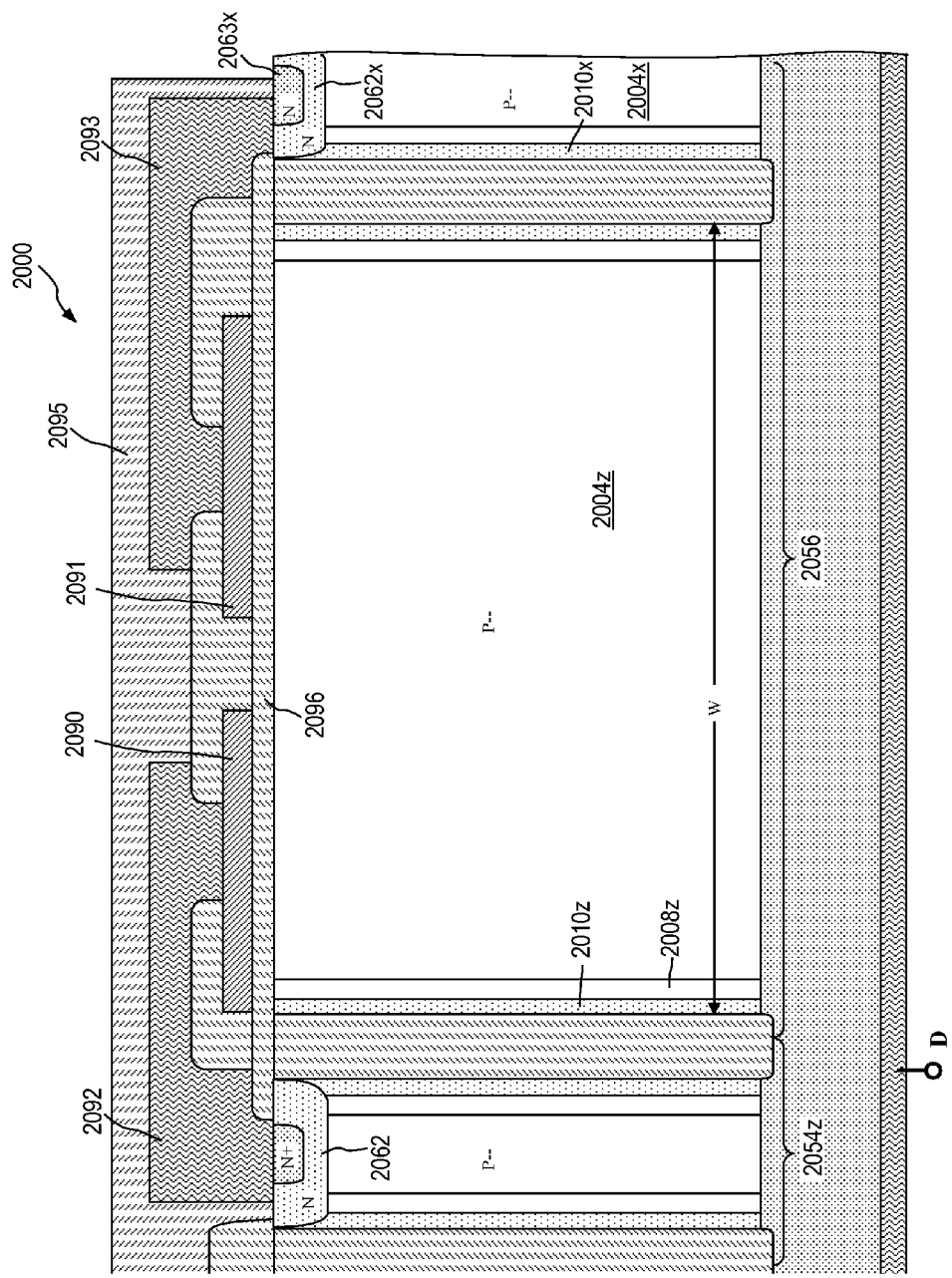
FIG. 29 is a cross-sectional view of an end termination cell of a termination structure incorporated in an integrated circuit including active devices constructed using the double nanotube process according to one embodiment of the present invention.

The termination structures described above details the construction of the termination cells used to step increase the voltage across the termination region of the integrated circuit. At the last termination cell, the voltage has been stepped up to the highest operating voltage for N-channel devices (or stepped down to the ground potential for P-channel devices). According to one aspect of the present invention, an end termination cell which may include a field plate is implemented in the termination structure at the interface between the last termination cell and the die edge. FIG. 29 is a cross-sectional view of an end termination cell of a termination structure incorporated in an integrated circuit including active devices constructed using the double nanotube process according to one embodiment of the present invention.

Referring to FIG. 29, an integrated circuit 2000 includes a termination structure having a series of termination cells of which the last termination cell 2054z is shown. The termination structure further includes an end termination cell 2056. End termination cell 2056 includes a wide P-Mesa layer 2004z with polysilicon field plates 2090 and 2091 formed on the P-Mesa layer 2004z, insulated from the P-Mesa layer 2004z by a dielectric layer 2096. The wide P-Mesa layer 2004z has a width of W much greater than the width of the other P-Mesa layer. End termination cell 2056 further includes a last P-Mesa layer 2004x at the die edge where the scribe line of the die is located. N-Epi nanotubes and P-Epi nanotubes line the sidewalls of P-Mesa layers 2004z and 2004x. In the present embodiment, P-Mesa layer 2004z has a width of about 40 μm wide.

Field plates 2090 and 2091 are provided to sustain a voltage drop across them so that the voltage at the N-doped region 2062 of the last termination cell 2054z is at lower potential than the highest operating voltage (HV) of the integrated circuit. The N-Epi nanotube 2010x of the end termination cell 2056 is connected to the drain potential which is the highest operating voltage. Field plates 2090 and 2091 are connected in series to carry additional breakdown voltage and operate to push the electric field from the die edge back to the last termination cell 2054z. More specifically, polysilicon field plate 2090 is electrically connected through a metal interconnect 2092 to the last termination cell 2054z. Polysilicon field plate 2091 is electrically connected through a metal interconnect 2093 to N-doped region 2062X and N+ region 2063x. The N-Epi nanotube 2010x is connected to the highest operating voltage through the connection to the N+ substrate and acts as a channel stop. Thus, polysilicon field plate 2091 is biased to the highest operating voltage. Field plates 2090 and 2091 push the electric field and the depletion region back towards the last termination cell. In this manner, the end termination cell 2056 shields the termination structure from the die edge. Also, the field plates can help to block additional voltage, and to protect the silicon surface from impurities and unwanted charge build-up, leading to a more rugged device with more reliable charge balance at the edges. Alternatively, the field plates may be made of another conductive material besides polysilicon, e.g., metal. In other embodiments, there may be only a single field plate, or the end termination cell may be omitted altogether. In the case the termination structure does not include the end termination cell, the last termination cell 2054z requires only the P-doped region to connect to the previous N-doped region and the last termination cell 2054z does not require the N-doped region 2062 (with or without the N+ region) as no further connection is to be made.

The above detailed descriptions are provided to illustrate specific embodiments of the present invention and are not intended to be limiting. Numerous modifications and variations within the scope of the present invention are possible. For example, the fabrication processes described with reference to FIGS. 9(a) to 9(l1) can be used to form a single nanotube instead of double nanotube. Also, the fabrication processes described with reference to FIGS. 16(a) and 16(b) can be used to form a single nanotube instead of double nanotube.

Furthermore, in the above description, a very heavily doped N++ substrate or a heavily doped N+ substrate is used in different embodiments of the present invention. In alternate embodiments of the present invention, the devices described above, including the MOS transistors, IGBT, Schottky diodes and P-N junction diodes, can be formed using a heavily doped N+ substrate or a very heavily doped N++ substrate.

Moreover, for either the single nanotube process or the double nanotube process and regardless how the substrate is provided, it is only necessary that the N-type nanotube becomes electrically connected to the N-type substrate. That is, the substrate can be provided as the starting material on which the P-type epitaxial layer is grown and etched to form the mesas, as shown in the processing steps in FIGS. 3(a) to 3(h) and FIGS. 4(a) to 4(d). In that case, the N-type substrate out-diffuses to electrically connect with the N-type nanotube. Alternately, the substrate can be provided as an N-type layer formed by ion implantation or epitaxial growth on the bottom of P-type mesa structure subjected to back grinding, as shown in FIGS. 9(a) to 9(l1). In that case, the N-type layer forming the N-type "substrate" is electrically connected to the N-type nanotube by virtue of the back-grinding and subsequent ion implantation or epitaxial process.

The above described embodiments are directed to an N-channel MOSFET. However, the nanotube transistor structure described above can be applied to form P-channel MOSFETs by reversing the polarities of conductivity types used for each semiconductor region.

The present invention is defined by the appended claims.

We claim:

1. A semiconductor device comprising:
a heavily doped semiconductor substrate of a first conductivity type;
a semiconductor layer of a second conductivity type formed on the heavily doped semiconductor substrate, the semiconductor layer comprising a plurality of trenches formed therein, the trenches extending close to, up to, or into the semiconductor substrate, the trenches forming mesas in the semiconductor layer;
a first epitaxial layer of the second conductivity type formed on sidewalls of the trenches, adjacent the mesas;
a second epitaxial layer of the first conductivity type formed on the first epitaxial layer;
a first dielectric layer formed in the remaining trenches, adjacent the second epitaxial layer, the first dielectric layer filling at least part of the trenches;
a gate dielectric layer formed on the sidewalls of the trenches above the first dielectric layer; and a gate conductive layer formed in a first trench above the first dielectric layer and adjacent the gate dielectric layer, wherein the first epitaxial layer and the second epitaxial layer form adjacent doped regions along the sidewalls of the trenches, the second epitaxial layer having a first thickness and a first doping concentration and the first epitaxial layer and a mesa of the semiconductor layer together having a second thickness and a second average doping concentration, the first and second thicknesses and the first and second doping concentrations being selected to achieve charge balance in operation.

2. The semiconductor device of claim 1, further comprising:

a body region of the second conductivity type formed in a top portion of a first mesa of the semiconductor layer, the body region extending to a depth near a bottom edge of the gate conductive layer formed in the first trench;

a heavily doped source region of the first conductivity type formed in the body region adjacent to the sidewall of the first trench, the source region extending from the top of the semiconductor layer to a depth near a top edge of the gate conductive layer; and a heavily doped body contact region of the second conductivity type formed in the body region adjacent the source region, wherein a vertical MOSFET is formed with the heavily doped N-type semiconductor substrate being a drain region, the first epitaxial layer being a drain drift region, and the gate conductive layer being a gate electrode of the vertical MOSFET.

3. The semiconductor device of claim 1, wherein the first epitaxial layer has a thickness of about 100 nm and the second epitaxial layer has a thickness of about 250 nm.

4. The semiconductor device of claim 1, wherein the semiconductor layer is a lightly doped epitaxial layer of the second conductivity type.

5. The semiconductor device of claim 1, wherein the first epitaxial layer is more heavily doped than the semiconductor layer.

6. The semiconductor device of claim 1, wherein a product of the first thickness and the first doping concentration of the second epitaxial layer is equal to a product of the second thickness and the second average doping concentration of the first epitaxial layer and the mesa of the semiconductor layer.

7. The semiconductor device of claim 1, wherein the first conductivity type comprises N-type conductivity and the second conductivity type comprises P-type conductivity.

8. The semiconductor device of claim 1, wherein the first conductivity type comprises P-type conductivity and the second conductivity type comprises N-type conductivity.

9. The semiconductor device of claim 1, wherein the semiconductor substrate comprises one of a very heavily doped substrate or a heavily doped substrate.

10. The semiconductor device of claim 1, further comprising:

a body region of the second conductivity type formed in a top portion of a first mesa of the semiconductor layer, the body region extending to a depth near a bottom edge of the gate conductive layer formed in the first trench;

a heavily doped source region of the first conductivity type formed in the body region adjacent to the sidewall of the first trench, the source region extending from the top of the semiconductor layer to a depth near a top edge of the gate conductive layer; and a source electrode electrically connected to the source region and the body region, a second semiconductor layer of a second conductivity type formed on a bottom surface of the semiconductor substrate, the second semiconductor layer forming an internal emitter region; and a collector electrode electrically connected to the second semiconductor layer, wherein an insulated gate bipolar transistor (IGBT) is formed with the semiconductor substrate being a buffer or field stop region, the body region being an internal collector region, the source electrode being an emitter electrode, and the gate conductive layer being a gate electrode of the IGBT.

11. The semiconductor device of claim 1, further comprising:

an anode contact region of the second conductivity type formed at a top surface in a second mesa of the semiconductor layer; and a Schottky metal layer formed on a top surface of the semiconductor layer and in contact with the first and second epitaxial layers and the anode contact region, the Schottky metal being in contact with the second epitaxial layer to form a Schottky junction, wherein a Schottky diode is formed with the semiconductor substrate being a cathode terminal and the Schottky metal layer being an anode terminal.

12. The semiconductor device of claim 1, further comprising:

a shallow lightly doped implant of the second conductivity type formed at a top surface of the second mesa of the semiconductor layer and enclosing the Schottky contact, the lightly doped region extending across the entire surface of the second mesa including the first and second epitaxial layers, the lightly doped implant being more lightly doped than the anode contact region.

13. The semiconductor device of claim 1, further comprising:

an anode contact region of the second conductivity type in a third mesa of the semiconductor layer and extending to the second epitaxial layer formed on the sidewalls of the trenches adjacent the third mesa, a P-N junction being formed between the anode contact region and the second epitaxial layer; and an ohmic metal layer on the top surface of the third mesa in electrical contact with the anode contact region, wherein a P-N junction diode is formed with the semiconductor substrate being a cathode terminal and the ohmic metal layer being an anode terminal.

14. A semiconductor device comprising:

a first semiconductor layer of a first conductivity type comprising a plurality of trenches formed therein, the plurality of trenches extending from a top surface to a bottom surface of the first semiconductor layer and forming mesas in the first semiconductor layer;

first semiconductor regions of a second conductivity type formed on the bottom surface of the mesas of the first semiconductor layer;

a first epitaxial layer of the second conductivity type formed on sidewalls of the trenches and covering at least sidewalls of the mesas of the first semiconductor layer, the first epitaxial layer being electrically connected to the first semiconductor regions formed at the bottom surface of the mesas;

a first dielectric layer formed in the trenches adjacent the first epitaxial layer, the first dielectric layer filling at least part of the trenches;

a gate dielectric layer formed on the sidewalls of at least a first trench above the first dielectric layer; and a gate conductive layer formed in the first trench above the first dielectric layer and adjacent the gate dielectric layer, wherein the first epitaxial layer forms doped regions along the sidewalls of the trenches, the first epitaxial layer having uniform doping concentration, the first epitaxial layer having a first thickness and a first doping concentration and a mesa of the first semiconductor layer having a second thickness and a second doping concentration, the first and second thicknesses and the first doping concentration and second doping concentrations being selected to achieve charge balance in operation where a product of the first thickness and the first doping concentration is equal to one half of a product of the second thickness and the second doping concentration.

15. The semiconductor device of claim 14, wherein the first semiconductor layer comprises a lightly doped semiconductor substrate of the first conductivity type.

16. The semiconductor device of claim 15, wherein a bottom portion of the semiconductor substrate is removed by back grinding up to the bottom of the plurality of trenches.

17. The semiconductor device of claim 16, wherein the first semiconductor regions are formed on the bottom surface of the mesas of the first semiconductor layer after back grinding of the semiconductor substrate.

18. The semiconductor device of claim 14, wherein the first semiconductor regions comprise implanted semiconductor regions of the second conductivity type.

19. The semiconductor device of claim 14, further comprising:
a second epitaxial layer of the first conductivity type formed on sidewalls of the trenches and covering at least sidewalls of the mesas of the first semiconductor layer,
wherein the first epitaxial layer is formed on the second epitaxial layer; and
wherein the first epitaxial layer and the second epitaxial layer form adjacent doped regions along the sidewalls of the trenches.

20. The semiconductor device of claim 14, further comprising:
a body region of the first conductivity type formed in a top portion of at least a first mesa of the first semiconductor layer, the body region extending to a depth near a bottom edge of the gate conductive layer formed in the first trench; and
a heavily doped source region of the second conductivity type formed in the body region adjacent to the sidewall of the first trench, the source region extending from the top of the first semiconductor layer to a depth near a top edge of the gate conductive layer,
wherein a vertical trench MOSFET is formed with the first semiconductor region formed at the first mesa being a drain region, the first epitaxial layer being a drain drift region, and the gate conductive layer being a gate electrode of the vertical trench MOSFET.

21. The semiconductor device of claim 20, wherein
a bottom metallization layer formed on the bottom surface of the first semiconductor layer, the bottom metallization layer being in electrical contact with the first semiconductor region and forming a drain electrode of the vertical trench MOSFET.

22. The semiconductor device of claim 14, wherein a product of the first thickness and the first doping concentration of the first epitaxial layer is about equal to one half of a product of the second thickness and the second doping concentration of the mesa of the first semiconductor layer.

23. The semiconductor device of claim 14, wherein the first conductivity type comprises N-type conductivity and the second conductivity type comprises P-type conductivity.

24. The semiconductor device of claim 14, wherein the first conductivity type comprises P-type conductivity and the second conductivity type comprises N-type conductivity.

* * * * *